United States Patent
Funk et al.

(10) Patent No.: US 7,113,838 B2
(45) Date of Patent: Sep. 26, 2006

(54) METHOD AND APPARATUS FOR MONITORING TOOL PERFORMANCE

(75) Inventors: Merritt Funk, Austin, TX (US); Masaki Tozawa, Fussa (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/987,194

(22) Filed: Nov. 15, 2004

(65) Prior Publication Data

US 2005/0171627 A1     Aug. 4, 2005

Related U.S. Application Data

(63) Continuation of application No. PCT/US03/16882, filed on May 28, 2003.

(60) Provisional application No. 60/383,619, filed on May 29, 2002.

(51) Int. Cl.
G06F 11/00       (2006.01)
G06F 19/00       (2006.01)

(52) U.S. Cl. ............... 700/108; 700/110; 700/121; 714/25

(58) Field of Classification Search ........... 700/95, 700/108, 109, 110, 121; 438/14; 714/25
See application file for complete search history.

(56) References Cited

U.S. PATENT DOCUMENTS

| | | | |
|---|---|---|---|
| 5,657,254 A | | 8/1997 | Sierk et al. |
| 5,672,230 A | | 9/1997 | Park et al. |
| 5,859,964 A | * | 1/1999 | Wang et al. ................... 714/48 |
| 6,338,001 B1 | * | 1/2002 | Steffan et al. ............... 700/121 |
| 6,594,589 B1 | * | 7/2003 | Coss et al. ..................... 702/34 |
| 6,721,616 B1 | * | 4/2004 | Ryskoski ..................... 700/108 |
| 6,725,402 B1 | * | 4/2004 | Coss et al. ..................... 714/48 |
| 6,805,810 B1 | * | 10/2004 | Smith et al. ................... 216/60 |
| 2003/0220708 A1 | * | 11/2003 | Sahin et al. ................. 700/121 |
| 2004/0111339 A1 | * | 6/2004 | Wehrung et al. .............. 705/30 |
| 2004/0163590 A1 | * | 8/2004 | Tran et al. ................... 118/715 |
| 2004/0267395 A1 | * | 12/2004 | Discenzo et al. ............. 700/99 |

FOREIGN PATENT DOCUMENTS

| | | |
|---|---|---|
| EP | 1 150 187 A2 | 10/2001 |
| JP | 7-282146 | 10/1995 |
| JP | 11-16798 | 1/1999 |

* cited by examiner

Primary Examiner—Jayprakash N. Gandhi
(74) Attorney, Agent, or Firm—Pillsbury Winthrop Shaw Pittman LLP

(57) ABSTRACT

A method and system for monitoring tool performance for processing tools in a semiconductor processing system. The semiconductor processing system includes a number of processing tools, a number of processing modules, a number of sensors, and an alarm management system. A tool health control strategy is executed in which tool health data for the processing tool is collected. A tool health analysis strategy is executed in which the tool health data is analyzed. An intervention manager can pause the processing tool when an alarm has occurred. The intervention manager refrains from pausing the processing tool when an alarm has not occurred.

35 Claims, 15 Drawing Sheets

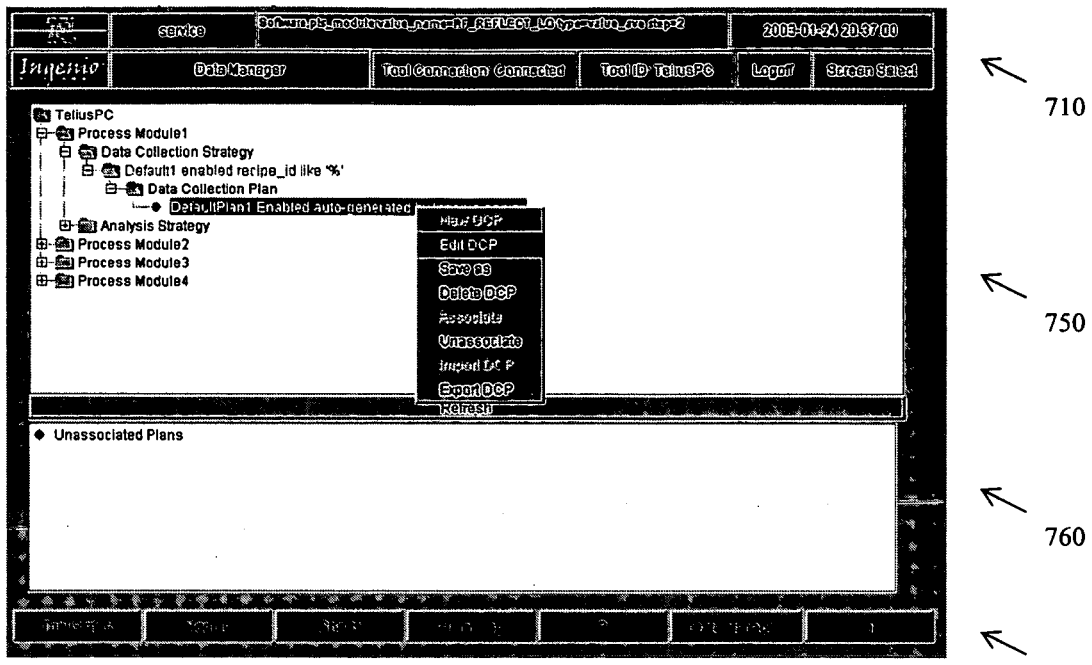
FIG. 7A  700
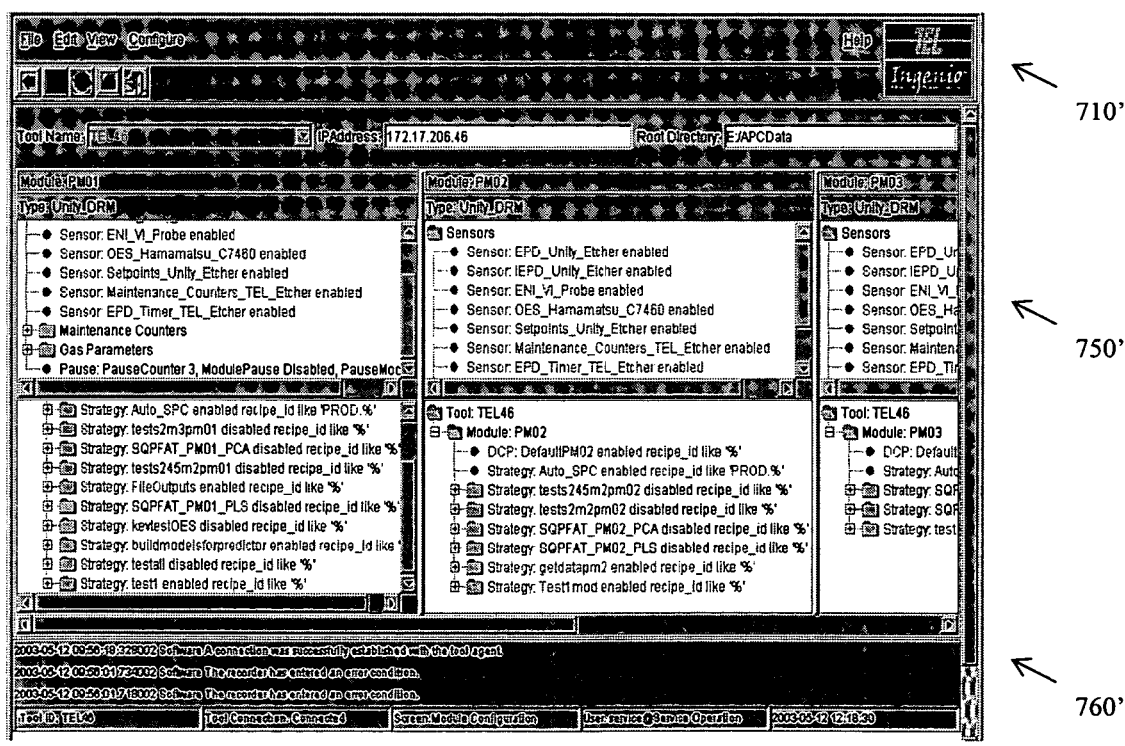
FIG. 7B  700'

METHOD AND APPARATUS FOR MONITORING TOOL PERFORMANCE

CROSS-REFERENCE TO RELATED APPLICATIONS

This is a continuation application of International Application No. PCT/US03/16882, filed on May 28, 2003; which is based on and claims the benefit of Provisional U.S. Patent Application No. 60/383,619, filed May 29, 2002, the contents of both of which are incorporated by reference herein in their entireties.

The present application is related to co-pending applications U.S. Provisional Application No. 60/368,162, entitled "Method for Interaction With Status and Control Apparatus", filed on Mar. 29, 2002; and U.S. Provisional Application No. 60/374,486, entitled "Method and Apparatus for Simplified System Configuration", filed on Apr. 23, 2002. Each of these applications is herein incorporated by reference in its entirety.

FIELD OF THE INVENTION

The present invention is related to semiconductor processing systems, particularly to semiconductor processing systems, which use Graphical User Interfaces (GUIs) to provide a monitoring system for tool status monitoring.

BACKGROUND OF THE INVENTION

The cost and tempo of developing new semiconductor devices and building new manufacturing plants is continually increasing. Time-to-market for new semiconductor devices is critical for the profitability and success of a company. Consumers expect the latest products and services instantaneously around the world. The need to quickly install new machines and processes is vital to meet the rapid shifts and changes in the semiconductor device market. Semiconductor manufacturing facilities also face the challenge of maintaining and controlling hundreds of complex manufacturing processes and machines. Meanwhile, the semiconductor manufacturing facilities must allow major changes in devices and processes to be developed and implemented in a relatively short period of time to create customer satisfaction.

Computers are generally used to control, monitor, and initialize manufacturing processes. A computer is ideal for these operations given the complexities in a semiconductor manufacturing plant from the reentrant wafer flows, critical processing steps, and maintainability of the processes. Various input/output (I/O) devices are used to control and monitor process flows, wafer states, and maintenance schedules. A variety of tools exist in a semiconductor manufacturing plant to complete these complicated steps from critical operations such as etching, to batch processing, and inspections. Most tool installations are accomplished using a display screen that is part of the graphical user interface (GUI) of a control computer containing the installation software.

Semiconductor processing facilities require constant monitoring. Processing conditions change over time with the slightest changes in critical process parameters creating undesirable results. Small changes can easily occur in the composition or pressure of an etch gas, process chamber, or wafer temperature. In many cases, changes of process data reflecting deterioration of processing characteristics cannot be detected by simply referring to the process data displayed. It is difficult to detect early stage abnormalities and characteristic deterioration of a process. Oftentimes prediction and pattern recognition offered by advanced process control (APC) is necessary.

Facility control is often performed by a number of different control systems having a variety of controllers. Some of the control systems may have man-machine interfaces such as touch screens, while others may only collect and display one variable such as temperature. The monitoring system must be able to collect data tabulated for the process control system. The data collection of the monitoring system must handle univariate and multivariate data, the analysis and display of the data, and have the ability to select the process variables to collect. Various conditions in a process are monitored by different sensors provided in each of the process chambers, and data of the monitored conditions is transferred and accumulated in a control computer. If the process data is displayed and detected automatically, the optimum process conditions of a mass-production line can be set and controlled through statistical process control (SPC) charts. Inefficient monitoring of a facility can result in facility downtimes that add to the overall operational cost.

SUMMARY OF THE INVENTION

Accordingly, one aspect of the present invention provides a method of monitoring a processing tool in a semiconductor processing system, the method comprising: putting the processing tool into a first state; executing a tool health control strategy; collecting tool health data for the processing tool; executing a tool health analysis strategy; analyzing the tool health data; pausing the processing tool when an alarm has occurred; and refraining from pausing the processing tool when an alarm has not occurred.

Another aspect of the present invention provides a tool status monitoring system for monitoring a processing tool in a semiconductor processing system, the tool status monitoring system comprising: a plurality of sensors coupled to the processing tool; means for executing a tool health control strategy including means for executing a data collection plan for collecting tool health data, and means for executing a data pre-processing plan for pre-processing the collected tool health data, the data collection plan comprising a sensor plan for controlling the data collected by the plurality of sensors; means for executing a tool health analysis strategy including means for executing a analysis plan for analyzing the tool health data and means for executing a judgment plan for determining if an alarm has occurred; and an intervention manager for pausing the processing tool when an alarm has occurred and refraining from pausing the processing tool when an alarm has not occurred.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention. A more complete appreciation of embodiments of the invention will be obtained with reference to the following detailed description, particularly when considered in conjunction with the accompanying drawings, in which:

FIG. 7A shows a simplified view of a selection screen in accordance with one embodiment of the present invention;

FIG. 7B shows another simplified view of a selection screen in accordance with another embodiment of the present invention;

DETAILED DESCRIPTION OF AN EMBODIMENT

In semiconductor manufacturing computers are generally used to control, monitor, and setup manufacturing processes. The embodiment described below provides a tool status monitoring system for a semiconductor processing system. The system can include the monitoring of processing tools, processing modules (chambers), and/or sensors, and the management of alarms associated with the tools, modules, and sensors. The embodiment employs a set of computer GUIs that are comprehensible, standardized in format, and simplify the tool status monitoring processes. The graphical displays are organized so that all significant parameters are clearly and logically displayed. GUI screens are provided that allow the user to make changes after system installation.

The tool status monitoring system can be provided in multiple languages. The page layouts have been designed to support in global installations. Users in many countries will find the tool status monitoring system easy to use and understand. When the tool status monitoring system is installed or the configuration is changed, the software creates the required databases and files for the user. The installation/configuration software GUI provides a means of interaction between the system and the end user installing the system.

The tool status monitoring system components can operate on a tool controller. In addition, the tool status monitoring system software components can operate on the APC server. In other embodiments, the tool status monitoring software components can operate on an external computer.

The tool status monitoring system allows integration of processing tools, process modules, and sensors into the customer networks. The tool status monitoring system also provides user configurablity and provides a user (process or control engineer) with the ability to easily specify data collection, analysis, alarm parameters, and to create and modify display screens without writing software or requesting support from software engineers. For example, the monitoring system can comprise a scripting engine that allows the user to create scripts for data collection, data analysis, data display, and alarm management.

Figure 1:
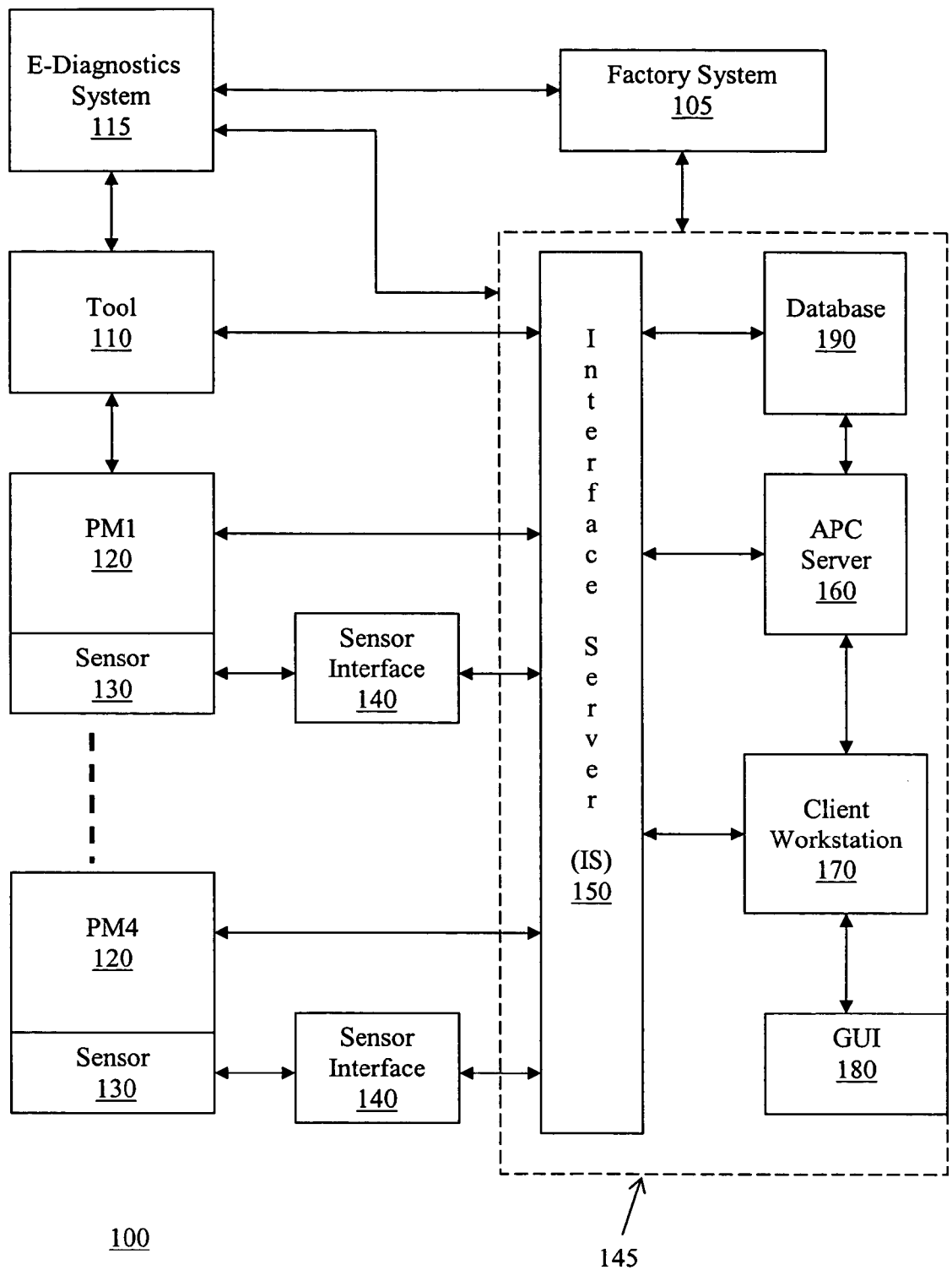
FIG. 1 shows a simplified block diagram of an advanced process controlled (APC) semiconductor manufacturing system in accordance with one embodiment of the present invention.

FIG. 1 shows an exemplary block diagram of an APC system in a semiconductor manufacturing environment in accordance with one embodiment of the present invention. In the illustrated embodiment, semiconductor manufacturing environment 100 comprises at least one semiconductor processing tool 110, multiple process modules 120, PM1 through PM4, multiple sensors 130 for monitoring the tool, the modules, and processes, sensor interface 140, and APC system 145. APC system 145 can comprise interface server (IS) 150, APC server 160, client workstation 170, GUI component 180, and database 190. In one embodiment, IS 150 can comprise a real-time memory database that can be viewed as a "hub".

APC system 145 can comprise a tool status monitoring system for monitoring the performance of at least one of a processing tool, a process module, and a sensor.

In the illustrated embodiment, a single tool 110 is shown along with four process modules 120, but this is not required for the invention. The tool status monitoring system can interface with a number of processing tools including cluster tools having one or more process modules. The tool status monitoring system can be used to configure and monitor a number of processing tools including cluster tools having one or more process modules. For example, the tools and their associated process modules can be used to perform etching, deposition, diffusion, cleaning, measurement, polishing, developing, transfer, storage, loading, unloading, aligning, temperature control, lithography, integrated metrology (IM), optical data profiling (ODP), particle detection, and other semiconductor manufacturing processes.

In one embodiment, processing tool 110 can comprise a tool agent (not shown), which can be a software process that runs on a tool 110 and which can provide event information, context information, and start-stop timing commands used to synchronize data acquisition with the tool process. Also, APC system 145 can comprise an agent client (not shown) that can be a software process that can be used to provide a connection to the tool agent. For example, APC system 145 can be connected to processing tool 110 via an internet or intranet connection.

In one embodiment, IS 150 communicates using sockets. For example, the interface can be implemented using TCP/IP socket communication. Before every communication, a socket is established. Then a message is sent as a string. After the message is sent, the socket is cancelled.

Alternately, an interface can be structured as a TCL process extended with C/C++ code, or a C/C++ process that uses a special class, such as a Distributed Message Hub (DMH) client class. In this case, the logic, which collects the process/tool events through the socket connection can be revised to insert the events and their context data into a table in IS 150.

The tool agent can send messages to provide event and context information to the tool status monitoring system. For example, the tool agent can sent lot start/stop messages, batch start/stop messages, wafer start/stop messages, recipe start/stop messages, and process start/stop messages. In addition, the tool agent can be used to send and/or receive set point data and to send and/or receive maintenance counter data.

When a processing tool comprises internal sensors, this data can be sent to the tool status monitoring system. Data files can be used to transfer this data. For example, some processing tools can create trace files that are compressed in the tool when they are created. Compressed and/or uncompressed files can be transferred. When trace files are created in the processing tool, the trace data may or may not include end point detection (EPD) data. The trace data provides important information about the process. The trace data can be updated and transferred after the processing of a wafer is completed. Trace files are be transferred to the proper directory for each process. In one embodiment, tool trace data, maintenance data, and EPD data can be obtained from a processing tool 110.

In FIG. 1, four process modules are shown, but this is not required for the invention. The semiconductor processing system can comprise any number of processing tools having any number of process modules associated with them and independent process modules. The APC system 145 including the tool status monitoring system can be used to configure and monitor any number of processing tools having any number of process modules associated with them and independent process modules. The tool status monitoring system can collect, provide, process, store, and display data from processes involving processing tools, process modules, and sensors.

Process modules can be identified using data such as ID, module type, gas parameters, and maintenance counters, and this data can be saved into a database. When a new process module is configured, this type of data can be provided using a module configuration panel/screen in GUI component 180. For example, the APC system can support the following tool types from Tokyo Electron Limited: Unity-related process modules, Trias-related process modules, Telius-related process modules, OES-related modules, and ODP-related modules. Alternately, the APC system can support other tools and their related process modules. For example, APC system 145 can be connected to process modules 120 via an internet or intranet connection.

In the illustrated embodiment, a single sensor 130 is shown along with an associated process module, but this is not required for the invention. Any number of sensors can be coupled to a process module. Sensor 130 can comprise an ODP sensor, an OES sensor, a VIP sensor, an analog sensor, and other types of semiconductor processing sensors including digital probes. The APC data management applications can be used to collect, process, store, display, and output data from a variety of sensors.

In the APC system, sensor data can be provided by both external and internal sources. External sources can be defined using an external data recorder type; a data recorder object can be assigned to each external source; and a state variable representation can be used.

Sensor configuration information combines sensor type and sensor instance parameters. A sensor type is a generic term that corresponds to the function of the sensor. A sensor instance pairs the sensor type to a specific sensor on a specific process module and tool. At least one sensor instance is configured for each physical sensor that is attached to a tool.

For example, an OES sensor can be one type of sensor; a VI probe can be another type of sensor, and an analog sensor can be a different type of sensor. In addition, there can be additional generic types of sensors and additional specific types of sensors. A sensor type includes all of the variables that are needed to set up a particular kind of sensor at run time. These variables can be static (all sensors of this type have the same value), configurable by instance (each instance of the sensor type can have a unique value), or dynamically configurable by a data collection plan (each time the sensor is activated at run time, it can be given a different value).

A "configurable by instance" variable can be the sensor/probe IP address. This address varies by instance (for each process chamber) but does not vary from run to run. A "configurable by data collection plan" variable can be a list of harmonic frequencies. These can be configured differently for each wafer based on the context information. For example, wafer context information can include tool ID, module ID, slot ID, recipe ID, cassette ID, start time and end time. There can be many instances of the same sensor type. A sensor instance corresponds to a specific piece of hardware and connects a sensor type to the tool and/or process module (chamber). In other words, a sensor type is generic and a sensor instance is specific.

As shown is FIG. 1, sensor interface 140 can be used to provide an interface between sensor 130 and the APC system 145. For example, APC system 145 can be connected to sensor interface 140 via an internet or intranet connection, and sensor interface 140 can be connected to sensor 130 via an internet or intranet connection. Also, sensor interface 140 can act as a protocol converter, media converter, and data buffer. In addition, sensor interface 140 can provide real-time functions, such as data acquisition, peer-to-peer communications, and I/O scanning. Alternately, sensor interface 140 can be eliminated, and the sensor 130 can be directly coupled to APC system 145.

Sensor 130 can be a static or dynamic sensor. For example, a dynamic VI sensor can have its frequency range, sampling period, scaling, triggering, and offset information established at run-time using parameters provided by a data collection plan. Sensor 130 can be an analog sensor that can be static and/or dynamic. For example, analog sensors can be used to provide data for ESC voltage, matcher parameters, gas parameters, flow rates, pressures, temperatures, RF parameters, and other process related data. Sensor 130 can comprise at least one of a: VIP probe, OES sensor, analog sensor, digital sensor, and a semiconductor processing sensor.

In one embodiment, a sensor interface can write the data points to a raw data file. For example, IS 150 can send a start command to the sensor interface to initiate data acquisition and can send a stop command to cause the file to be closed. IS 150 can then read and parse the sensor data file, process the data and post the data values into the in-memory data tables.

Alternately, the sensor interface could stream the data in real time to the IS 150. A switch could be provided to allow the sensor interface to write the file to disk. The sensor interface can also provide a method to read the file and stream the data points to the IS 150 for off-line processing and analysis.

As shown in FIG. 1, APC system 145 can comprise a database 190. Tool status monitoring data can be stored in database 190. In addition, raw data and trace data from the tool can be stored as files in the database 190. The amount of data depends on the data collection plans configured by the user, as well as the frequency with which processes are performed and processing tools are run. For example, data collection plans can be established for determining how and when to collect tool status data. The data obtained from the processing tools, the processing chambers, the sensors, and the APC system is stored in tables.

In one embodiment, the tables can be implemented in the IS 150 as in-memory tables and in database 190 as persistent storage. The IS 150 can use Structured Query Language (SQL) for column and row creation as well as posting data to the tables. The tables can be duplicated in the persistent tables in database 190 (i.e., DB2 can be used) and can be populated using the same SQL statements.

In the illustrated embodiment, IS 150 can be both an in-memory real-time database and a subscription server. For example, client processes are able to perform database functions using SQL with the familiar programming model of relational data tables. In addition, the IS 150 can provide a data subscription service where the client software receives asynchronous notification whenever data that meets their selection criteria is inserted, updated, or deleted. A subscription uses the full power of an SQL select statement to specify which table columns are of interest and what row selection criteria is used to filter future data change notifications.

Because the IS 150 is both a database and a subscription server, clients can open "synchronized" subscriptions to existing table data when they are initialized. The IS 150 provides data synchronization through a publish/subscribe mechanism, in-memory data tables, and supervisory logic for marshalling events and alarms through the system. The IS 150 provides several messaging TCP/IP based technologies including sockets, UDP, and publish/subscribe.

For example, the IS 150 architecture can use multiple data hubs (i.e., SQL databases) that can provide real-time data management and subscription functions. Application modules and user interfaces use SQL messages to access and update information in the data hub(s). Due to performance limitations associated with posting run time data to the relational database, run time data is posted to in-memory data tables managed by the IS 150. The contents of these tables can be posted to the relational database at the end of wafer processing.

In the illustrated embodiment shown in FIG. 1, a single client workstation 170 is shown but this is not required for the invention. The APC system 145 can support a plurality of client workstations 170. In one embodiment, the client workstation 170 allows a user to perform configuration procedures; to view status including tool, chamber, and sensor status; to view process status; to view historical data; and to perform modeling and charting functions.

In the illustrated embodiment shown in FIG. 1, APC system 145 can comprise an APC server 160 that can coupled to IS 150, client workstation 170, GUI component 180, and database 190, but this is not required for the invention. The APC server 160 can comprise a number of applications including at least one tool-related application, at least one module-related application, at least one sensor-related application, at least one IS-related application, at least one database-related application, and at least one GUI-related application. In addition, APC server can comprise a number of tool status monitoring system applications.

The APC server 160 comprises at least one computer and software that supports multiple process tools; collects and synchronizes data from tools, process modules, sensors, and probes; stores data in a database, enables the user to view existing charts; and provides fault detection. For example, APC server 160 can comprise operational software, such as the Ingenio software, from Tokyo Electron. The APC server allows online system configuration, online lot-to-lot fault detection, online wafer-to-wafer fault detection, online database management, and performs multivariate analysis of summary data using models based upon historical data. In addition, the tool status monitoring system allows real-time monitoring of the processing tools.

For example, APC server 160 can comprise a minimum of 3 GB available disk space; at least 600 MHz CPU (Dual processors); a minimum 512 Mb RAM (physical memory); a 9 GB SCSI hard drives in a RAID 5 configuration; a minimum disk cache that is twice the RAM size; Windows 2000 server software installed; Microsoft Internet Explorer; TCP/IP Network protocol; and at least two network cards.

APC system 145 can comprise at least one storage device that stores files containing raw data from sensors and files containing trace data from the tool. If these files are not managed properly (i.e., deleted regularly), the storage device can run out of disk space, and can stop collecting new data. The APC system 145 can comprise a data management application that allow the user to delete older files, thereby freeing disk space so that data collection can continue without interruption. The APC system 145 can comprise a plurality of tables that are used to operate the system, and these tables can be stored in database 190. In addition, other computers (not shown), such as on-site or off-site computers/workstations and/or hosts, can be networked to provide functions such as data/chart viewing, SPC charting, EPD analysis, file access, for one or many tools.

As shown in FIG. 1, the APC system 145 can comprise a GUI component 180. For example, a GUI component can run as an application on the APC server 160, client workstation 170, and tool 110.

GUI component 180 enables an APC system user to perform the desired configuration, data collection, monitoring, modeling, and troubleshooting tasks with as little input as possible. The GUI design complies with the SEMI Human Interface Standard for Semiconductor Manufacturing Equipment (SEMI Draft Doc. #2783B) and with the SEMATECH Strategic Cell Controller (SCC) User-Interface Style Guide 1.0 (Technology Transfer 92061179A-ENG). Those skilled in the art will recognize that GUI panels/screens can comprise a left-to-right selection tab structure and/or a right-to-left structure, a bottom-to-top structure, a top-to-bottom structure, or a combination structure.

In addition, although the screens shown for illustration were English language versions this is not required for the invention and different languages can be used. For example, a Japanese language screen, a Chinese language screen, a Taiwanese language screen, a Korean language screen, a German language screen, and a French language screen can be used.

Also, GUI component 180 provides a means of interaction between the tool status monitoring system and the user. When the GUI begins, a logon screen that validates the user identification and password can be displayed and that provides a first level of security. Desirably, users can be registered using a security application before logging on. A database check of user identification indicates an authorization level, which will streamline the GUI functions available. Selection items for which the user is not authorized can be differently and unavailable. The security system also allows a user to change an existing password. For example, the logon panel/screen can be opened from a browser tool such as Netscape or Internet Explorer. A user can enter a user ID and password in the logon fields.

Authorized users and administrators can use GUI panels/screens to modify system configuration and sensor setup parameters. The GUI component 180 can comprise a configuration component for allowing a user to configure processing tools, processing modules, sensors, and the APC system. For example, GUI configuration panels/screens can be provided for at least one of a processing tool, a processing module, a sensor, a sensor instance, a module pause, and an alarm. Configuration data can be stored in an attribute database table and can be setup with the defaults at the installation.

The GUI component 180 can comprise a status component for displaying the current status for processing tools, processing modules, sensors, and the APC system. In addition, the status component can comprise a charting component for presenting system-related and process-related data to a user using one or more different types of charts.

Also, GUI component 180 can comprise a real-time operational component. For example, a GUI component can be coupled to a background task, and shared system logic can provide the common functionality used both by the background task and by the GUI component. Shared logic can be used to guarantee that the returned values to the GUI component are the same as the ones returned to the background task. Furthermore, the GUI component 180 can comprise an APC file management GUI component and a security component. Help panels/screens are also available. For example, help files are provided in PDF (Portable Document Format) and/or HTML format.

As shown in FIG. 1, an APC system 145 including a tool status monitoring system can be coupled to a factory system 105 and/or an E-Diagnostics system 115. Factory system 105 and/or E-Diagnostics system 115 can provide means for externally monitoring and for externally controlling the tools, modules, sensors, and processes in a semiconductor processing system. Alternately, the factory system 105 and/or an E-Diagnostics system 115 can perform tool status monitoring. For example, a user can access the tool status monitoring system using a web based terminal that is coupled to the semiconductor processing system via factory system 105 and/or an E-Diagnostics system 115.

In addition, the APC system and the E-Diagnostic system can work together to solve problems in real time. For example, when the APC system 145 detects a fault, the information needed to diagnose the problem can be bundled by the APC server and transmitted to the E-Diagnostic system or stored for access by the E-Diagnostic system at a later time. The operating method can be determined using security constrains and/or customer business rules.

Also, the APC comprises means for adding sensors, editing data collection plans that are context and/or event driven. For example, this can allow E-Diagnostics "probes" and/or software components to be downloaded for the E-Diagnostic system to trouble shoot the system. The E-Diagnostic system can comprise a portable set of diagnostic tools that can provide additional data, which can be used to diagnose, detect, and/or predict a problem. For example, the APC system can use these diagnostic tools as additional sensors. With a general sensor interface that support multiple protocols, including analog input as the lowest level, a local portable diagnostic unit can be coupled to the factory system and then used remotely by the APC system, the E-Diagnostic system and/or the factory system.

The APC system can be provided with a new application that was remotely developed at the factory and downloaded from the factory or the E-Diagnostic system. For example, the new application can reside locally in the APC server. The APC system has the ability to learn new procedures and dynamically add sensors, add applications, and even add GUI screens for a custom sensor. Furthermore, the APC system can perform very specific procedures such as a timing analysis allocation to figure out when a tool and/or module malfunctions (i.e. a wafer handling system problem with a motor or actuator arm position).

In addition, the APC system can change the sampling rate based on the tool performance. For example, the data collection sampling rates and amount of analysis can be changed based on tool health. The APC system can also predict a problem or detect that a tool and/or module is running near a limit condition.

In addition, advanced users and administrators can use GUI screens to modify system configuration and sensor setup parameters; create and edit tool-related strategies and plans; and/or modify the number tools and modules.

The tool status monitoring system is implemented using a configurable system that enables customers (end users) to add processing tools, process modules, and/or sensors. The tool status monitoring system provides a development environment and methodology that enables customers to customize the monitoring software, to add analysis applications, and/or to install and monitor new tools, modules, and sensors in the environment.

The tool monitoring portion of the system improves the Overall Equipment Effectiveness (OEE) and Cost Of Ownership (COO) of the processing tools by providing the customer with a tool health monitor that extends the tool's consumable life and provides detection of potential failure signatures.

The tool status monitoring system software architecture includes four functional components: a data acquisition component, a messaging system component, a relational database component, and a post-processing component. The architecture also includes in-memory data tables used for storing run-time data acquisition parameters. External to the tool status monitoring system is the tool, as well as a tool agent, which provides context information and start-stop timing commands used to synchronize data acquisition with the tool process.

The data acquisition component collects data points, called parameters and writes them to a file. The messaging system uses in-memory data tables for temporary storage of the run-time data received from the data acquisition component. The messaging system is notified of the start and end of the data acquisition period by an agent and/or tool client. At the end of the data acquisition period, the data is posted to the relational database and the in-memory data tables are cleared for the next acquisition period. Post processing of the data supplied by the messaging system is performed at run-time; post processing of the data stored in the relational database is performed off-line.

The goal of the tool status monitoring system is to use real-time and historical data to improve the semiconductor processing system's performance. To achieve this goal, potential problems can be predicted and corrected before they occur, thus reducing equipment downtime and the number of non-product wafers that are produced. This can be accomplished by collecting data and then feeding that data into a software algorithm that models the behavior of a particular tool. The tool status monitoring system outputs process parametric adaptations that are then either fed forward or back to keep the tool performance within the specified limits. This control can be accomplished in different forms at different levels.

The alarm management portion of the tool status monitoring system can provide fault detection algorithms, fault classification algorithms, and/or fault forecasting algorithms. The tool status monitoring system can predict when a tool will malfunction, and can identify possible solutions to correct the malfunction and to reduce the number of non-product wafers that are produced during maintenance and processing functions.

Fault forecasting is a combination of fault detection and failure modeling. This method can be used to optimize chamber cleaning and the replacement of consumable parts and it is intended to facilitate "opportunistic scheduling" of preventive maintenance tasks when there is a lull in production. Fault forecasting can be based either on a complex multivariate model or a simple univariate relationship (e.g. APC angle for a wet clean in etch).

Figure 2:
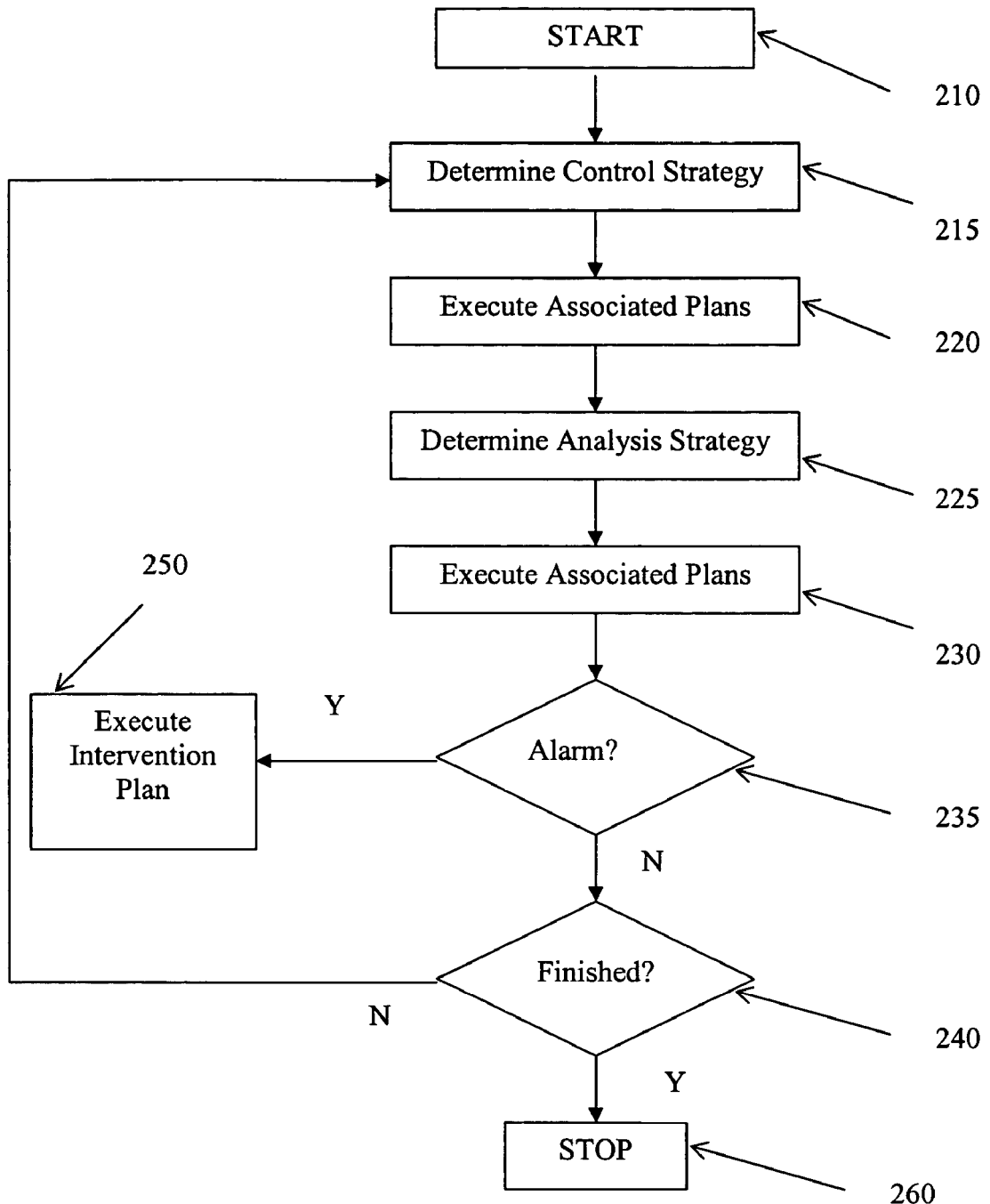
FIG. 2 shows a simplified view of a flow diagram for a monitoring process for processing tools in a semiconductor processing system in accordance with one embodiment of the present invention.

FIG. 2 shows a simplified view of a flow diagram for a monitoring process for processing tools in a semiconductor processing system in accordance with one embodiment of the present invention. The software and associated GUI screens provides a procedure for monitoring one or more processing tools in the system. The flow chart illustrates an exemplary Control Strategy procedure that is executed in the monitoring process. Procedure 200 starts in 210.

Procedure 200 can be performed for each production step being performed by a processing tool in the semiconductor processing system. A production step is an etching process, a deposition process, a diffusion process, a cleaning process, a measurement process, a transfer process, or other semiconductor manufacturing process. Strategies define what happens during a set of sequences on the processing tool. Strategies can define a set of sequences for a single wafer, a single tool, a single lot, or a combination of tool activities. A strategy can include a combination of processing activities, measurement activities, pre-conditioning activities, pre-measurement activities, and post-measurement activities. Each part (group of activities) in a strategy is called a plan.

Strategies are associated with a context. Context information can be used to associate a given operation with another operation. In particular, the context information associates a process step or recipe with one or more strategies and/or plans.

In 215, a control strategy is determined based on a process context. The process context can be dependent upon the production step being performed and the tool being monitored. The context determines which strategy and/or plan is executed for a particular process recipe. For example, to associate a control strategy with a process type such as "dryclean", the context for the strategy must contain the context term "dryclean".

The control strategy can be a holder of plans. A control strategy and the associated plans "control" which sensors are used, how they are configured, which data is collected, and how the data is preprocessed.

In one embodiment, a process context can be compared with one of the control strategies. For example, APC server 160 (FIG. 1) gets the current process context as a string when a "process start" event occurs. The process context can be compared with one of the control strategies, and then a proper strategy can be identified.

In this process, search order can be important. For example, the search can be executed by using the precedence order in a GUI table. A search can be implemented using Structured Query Language (SQL) statements. Once a strategy is identified, a data collection plan, a data preprocessing plan and a judgment plan are automatically determined. The data collection plan ID, data preprocessing plan ID, and judgment plan ID are sent to "execute control strategy" modules. If a matching strategy does not exist when the compare process context function is performed, then the software displays an error message in the fault field in tool status screen and popup windows.

There can be multiple control strategies that match a run context, but only one control strategy is executed at a particular time for a particular processing tool. The user determines the order of the strategies within a specific context by moving the strategies up or down on the list. When the time comes for the strategy to be selected, the software starts at the top of the list and goes down the list until it finds the first strategy that matches the requirements determined by the context.

One method for using context-based execution can be to do context matching. For example, when executing context matching, the context of the wafer currently being processed can be used. Alternately, the context of a substrate or other semiconductor product currently being processed can be used. When the context is determined, it can be compared with the control strategies. When a context match occurs, one or more control strategies can be executed.

Context can be defined by a combination of the context elements. For example, context can be an array of the context elements in a pre-determined order, or context may be a set of name-value pairs in a dictionary form.

Context elements used to select and execute a control strategy can include a tool ID, a recipe ID, a lot ID, and a material ID. In addition, the following elements can be used:

a cassette ID, a process module ID, a slot ID, a recipe start time, a recipe stop time, a maintenance counter value, and/or a product ID, which specifies the kind of product to be processed.

Figure 3:
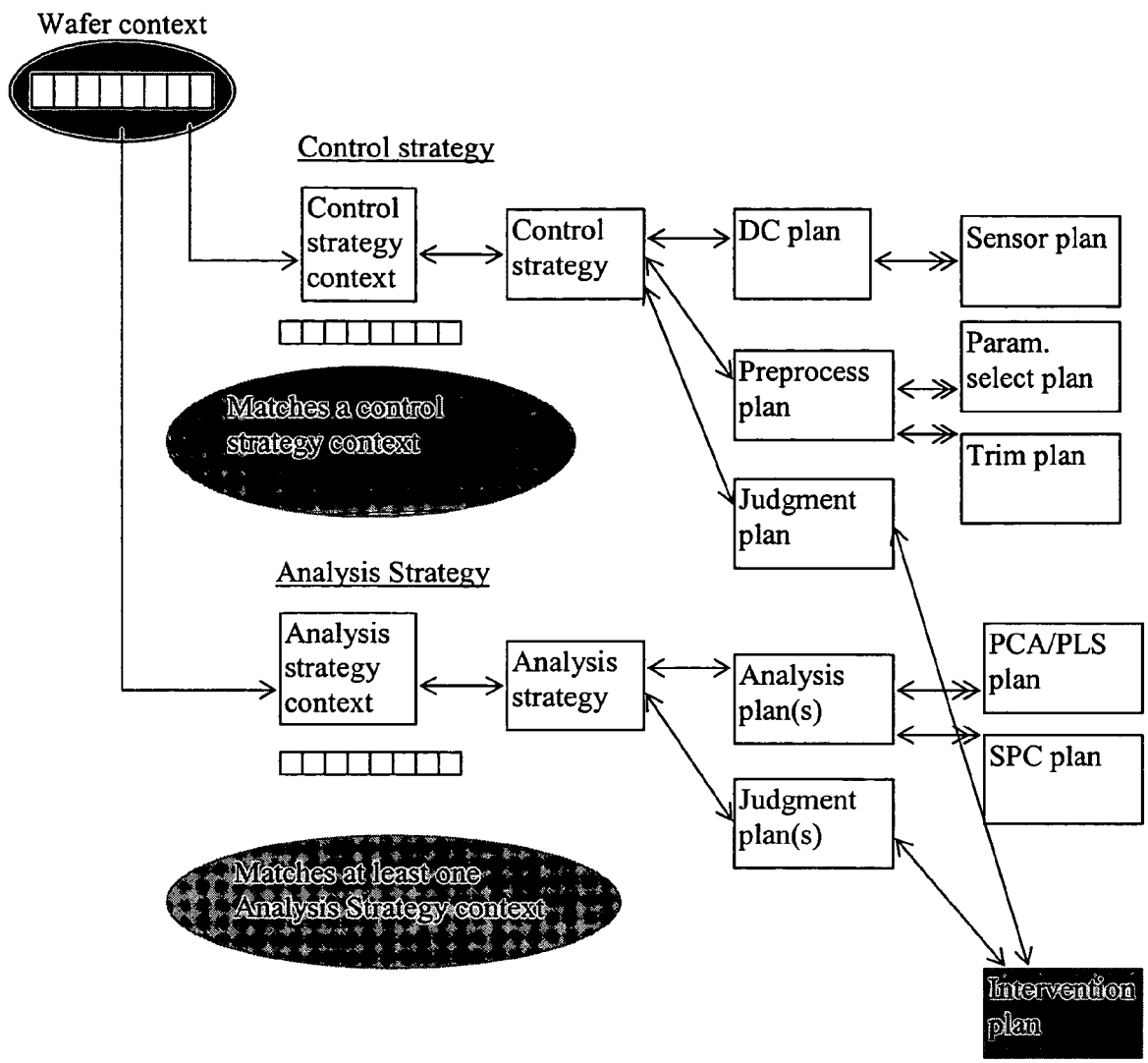
FIG. 3 shows an exemplary relationship diagram for strategies and plans in accordance with one embodiment of the present invention.

When a control strategy is executed, a data collection plan can be identified, a data pre-processing plan can be identified, and a judgment plan can be identified. An exemplary relationship diagram for strategies and plans is shown in FIG. 3. For example, a context-matching execution software module can be used that allows for the dynamic setup and invocation of a control strategy. In one case, a wafer-in event can trigger a system controller to look up the current context data, determine which strategy to run, and invoke the corresponding scripts to determine the associated plans.

In 220, the plans associated with the control strategy are executed. At least one of a data collection plan, a data pre-processing plan, and a judgment plan can be executed. In addition, a sensor plan, a parameter select plan, and/or a trim plan can also be executed.

Data collected during production runs that yield high quality product can be used to establish "good tool state" data, and data collected subsequently can be compared with this baseline data to determine if a tool is performing correctly in real-time.

A control strategy can be established to determine tool health status as part of the Quality Control (QC) testing. A tool health control strategy and its associated plans can be executed to ensure that a system or a portion of the system such as a processing tool is operating properly. A tool health control strategy and its associated plans can be executed at a prescribed time or when a user schedules one. When a tool health control strategy and its associated plans are being executed, diagnostic wafer data can be collected. For example, a diagnostic, dummy, product, or test wafer can be processed, and the context can be tool, module, or sensor diagnostics.

A tool health control strategy and its associated plans can be established for process module preparation processes, such as seasoning-related processes. For example, after a cleaning process (i.e., wet clean) a number of dummy wafers can be processed using seasoning related strategies, plans, and recipes. A user can use the strategies and plans that are part of the APC system, or a user can develop new seasoning-related control strategies using the APC system. A user may try a set of different seasoning data collection plans and recipes to determine which seasoning recipe has the best detection power. The data from these seasoning runs can be used to further refine process and tool modeling.

A tool health control strategy and its associated plans can be established for process module characterization processes, such as chamber fingerprinting. For example, after a maintenance process a number of dummy wafers can be processed using fingerprinting-related data collection plans and recipes. The data from these fingerprinting runs can be used to further refine process and tool modeling. The fingerprinting data can be used for analysis to identify the best model that will minimize the critical chamber mismatches that affect the on-wafer process results.

Static and dynamic sensors are setup when a data collection plan is executed. The data collection plan comprises a sensor setup plan. For example, the start and stop times for the sensors can be determined by the sensor setup plan. The dynamic variables required by dynamic sensors can be determined by the sensor setup plan. A recipe start event can be used to tell a sensor to start recording. A wafer in event can be used to setup a sensor. A recipe stop event or a wafer out event can be used to tell a sensor to stop recording.

The data collected and the sensors being used are dependent upon the control strategy context. Different sensors can be used and different data can be collected for product wafers and non-product wafers. For example, tool status data can be a small portion of the data collected for a product wafer, and tool status data can be a large portion of the data collected for a non-product wafer.

The data collection plan also includes a data preprocessing plan that establishes how the expected observation parameters are to be processed with respect to spike counting, step trimming, value thresholds, and value clip limits.

When the data preprocessing plan is executed, time series data can be created from raw data files and saved in the database; wafer summary data can be created from the time series data; and lot summary data can be created from the wafer data. The data collection can be executed while the wafer is being processed. When the wafer is out of this process step, then the data pre-processing plan can be executed.

A tool health data collection plan is a reusable entity configured by the user to collect the desired tool health data. The data collection plan consists of the configuration of one or more sensors on one or more separate modules. The plan also includes the selection of the data items that should be collected by the associated sensors, and which of the data items are to be saved.

A sensor can be a device, instrument, processing tool, process modules, sensor, probe, or other entity that either collects observation data or requires software setup interaction, or can be handled by the system software as if it is a sensor. For example, processing tools and process modules can be treated as if they are sensors in data collection plans.

Several instances of the same sensor type can be installed on a tool at the same time. The user can select the specific sensor or sensors to use for each data collection plan.

Data collected in the system flows through a set of steps between the real-time sensor collection and the database storage. Data collected can be sent to a "datahub" that can comprise a real-time memory SQL database. The "datahub" can provide a physical location for the data to be processed by different algorithms defined by the user through plans in the tool status monitoring system and by scripts defined by the user.

The tool status monitoring system provides independent data collection modes and setup modes for each process module; that is, each process module can be independent of any other process modules, and the setup of one process module does not interrupt the data collection of other process modules. This reduces the amount of non-productive time for the semiconductor processing system.

When a tool health control strategy comprises a judgment plan, the judgment plan is executed. The execution can be rule based and comprise SQL statements. A start-event judgment plan can be executed after a "start event" occurs, and an end-event judgment plan can be executed after an "end event" occurs. For example, when a start-event judgment plan is associated with a control strategy, it can be executed after a start event such as a wafer-in event, a process start event, or a recipe start event. A start-event judgment plan can be part of the alarm management portion of a tool status monitoring system.

When an alarm occurs (i.e., a fault is detected) after a start event, a judgment plan associated with a control strategy can send messages and/or instructions to an intervention plan to take the following actions: display a fault message on a status screen, write a fault message in a log file, send a pause next wafer message, send a pause next lot message, send a warning message to the tool, and/or email to the tool owner.

Figure 4:
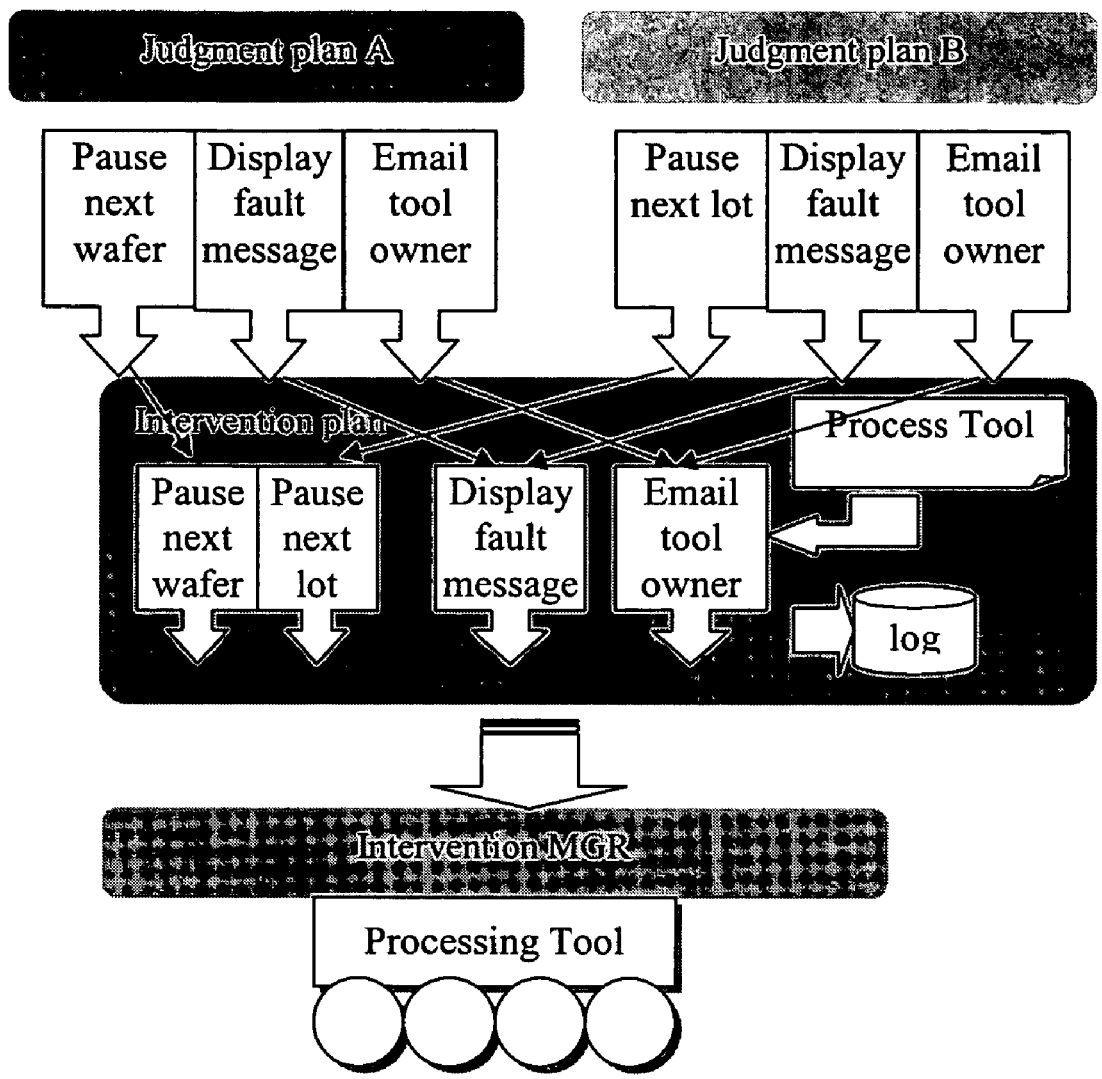
FIG. 4 shows an exemplary relationship diagram for judgment plans and intervention plan in accordance with one embodiment of the present invention.

Judgment plans operate independently. Each judgment plan does not know the actions in other judgment plans. As a result, there can be some redundancy or inconsistency in actions, and an intervention plan can be used to resolve any problems. An exemplary relationship diagram for judgment plans and an intervention plan is shown in FIG. 4.

In 225 (FIG. 2), the analysis strategy can be determined based on a process context. The process context can be dependent upon the production step being performed and the tool being monitored. The context determines which analysis strategy and/or plan is executed for a particular process step. For example, to associate an analysis strategy with a process type such as "dryclean", the context for the analysis strategy should contain the context term "dryclean".

An analysis strategy can be a holder of plans. An analysis strategy and the associated plans "analyze" the data after collection.

In one embodiment, a process context can be compared with a list of analysis strategies. For example, APC server 160 (FIG. 1) gets the current process context as a string when a "process start" event occurs. The process context can be compared with the list of analysis strategies, and then the proper strategies are identified.

In this process, search order can be important. For example, the search can be executed by using the precedence order in a GUI table. A search can be implemented using SQL statements. When an analysis strategy is identified, at least one of a Statistical Process Control (SPC) plan, a Partial Least Squares (PLS) plan, a Principal Component Analysis (PCA) plan, a Multivariate Analysis (MVA) plan, a Fault Detection and Classification (FDC) plan, a judgment plan, and a user defined plan can be automatically determined. The analysis plan IDs, and judgment plan IDs can be sent to "execute analysis strategy" modules. If a matching strategy does not exist when the compare process context function is performed, then the software can display an error message in the fault field in tool status screen and popup windows.

There can be multiple analysis strategies that match a run context, these analysis strategies are executed at a particular time for a particular processing tool. The user determines the order of the strategies within a specific context by moving the strategies up or down on the list. When the time comes for the strategy to be selected, the software can start at the top of the list and goes down the list until it finds the first strategy that matches the requirements determined by the context and executes that strategy first.

In addition, there can be multiple plans in each analysis strategy, and the user determines the order of the plans within an analysis strategy by moving the plans up or down on the list. When the time comes for the plans to be executed, the software starts at the top of the list and goes down the list.

One method for using context-based execution can be to do context matching. For example, when executing context matching, the context of the wafer currently being processed can be used. Alternately, the context of a substrate or other semiconductor product currently being processed can be used. When the context is determined, it can be compared with the analysis strategies. When a context match occurs, one or more analysis strategies can be executed.

When an analysis strategy is executed, analysis plans and judgment plans are identified. An exemplary relationship diagram for strategies and plans is shown in FIG. 3. For example, a context-matching execution software module can be used that allows for the dynamic setup and invocation of at least one analysis strategy. In one case, a wafer-out event can trigger a system controller to look up the current context data, determine which analysis strategies to run, and invoke the corresponding scripts to determine the associated plans.

In 230, the plans associated with the analysis strategy are executed. When the analysis plans are executed, at least one of a SPC plan, a PLS plan, a PCA plan, a MVA plan, a FDC plan, a judgment plan, and a user defined plan can be executed. Analysis performed on data collected during production runs that yield high quality product can be used to establish a "good tool state" model, and data collected subsequently can be analyzed using this baseline model to determine if a tool is performing correctly in real-time.

An analysis strategy can be established to determine tool health status as part of the Quality Control (QC) testing. A tool health analysis strategy and its associated plans can be executed to ensure that a system or a portion of the system such as a processing tool is operating properly. A tool health analysis strategy and its associated plans can be executed at a prescribed time or when a user schedules one. When a tool health analysis strategy and its associated plans are being executed, diagnostic wafer data can be analyzed using diagnostic models. For example, diagnostic models can include SPC charts, PLS models, PCA models, FDC models, and MVA models.

A tool health analysis strategy and its associated plans can be established for process module preparation processes, such as seasoning-related processes. For example, after a cleaning process (i.e., wet clean) the data collected from a number of dummy wafers can be analyzed using seasoning related models. A user can use the analysis strategies, plans, and models that are part of the APC system, or a user can easily and quickly develop new seasoning-related analysis strategies, plans, and models using the APC system. A user may try different analysis models to determine which seasoning related model has the best detection power. The analysis results from these seasoning runs can be used (fed back) to further refine the control strategies and data collection plans.

A tool health analysis strategy and its associated plans can be established for process module characterization processes, such as chamber fingerprinting. For example, after a maintenance process the data collected from a number of dummy wafers can be analyzed using fingerprinting-related models. The analysis results from these fingerprinting runs can be used (fed back) to further refine the control strategies and data collection plans. The analysis results can be used to identify the best model that will minimize the critical chamber mismatches that affect the on-wafer process results.

When a tool health analysis strategy comprises a judgment plan, the judgment plan can be executed. The execution can be rule based and comprise SQL statements. A start-event judgment plan can be executed after a "start event" occurs, and an end-event judgment plan can be executed after an "end event" occurs. For example, when an end-event judgment plan is associated with an analysis strategy, it can be executed after an end event such as a wafer-out event, a process stop event, a recipe stop event, a batch-out event, or a lot-out event. An end-event judgment plan can be part of the alarm management portion of a tool status monitoring system.

When an alarm occurs (i.e., a fault is detected) after a end event, a judgment plan associated with an analysis strategy can send messages and/or instructions to an intervention plan to take the following actions: display a fault message on a status screen, write a fault message in a log file, send a pause next wafer message, send a pause next lot message, send warning message to the tool, and/or send an email to the tool owner.

Judgment plans operate independently. Each judgment plan does not know the actions in other judgment plans. As a result, there can be some redundancy or inconsistency in actions, and an intervention plan can be used to resolve any problems. An exemplary relationship diagram for judgment plans and intervention plan is shown in FIG. 4.

In 235 (FIG. 2), a query can be performed to determined if an alarm has been produced. When an alarm has occurred, procedure 200 branches to 250. When an alarm has not occurred, procedure 200 branches to 240.

In 250, an intervention plan can be executed. The intervention plan executes the following processes: get messages Judgments) from each judgment plan; categorize actions from different judgment plans; attach process conditions like tool ID, recipe ID, recipe start time, etc. for an email and a log; save the log in a file/database; and send a proper message to an intervention manager.

Intervention strategies are defined as the action the user chooses to take as the result of data analysis. For example, these actions can include: flag a suspect wafer or lot and notify a system owner and/or tool owner; page or e-mail an engineer to review the data and make a decision; inhibit the tool from processing wafers until the data has been reviewed and the inhibit released; stop the tool or take the tool "off-line" which can purge the remaining wafers from the tool; and/or trigger chamber cleaning or maintenance procedures.

Desirably, only one intervention plan executes during each process step. Intervention plan execution can be implemented in the APC server as part of the "datahub" application. For example, an intervention plan can get information (strings) from judgment plans. This information can include a Judgment plan ID, messages with suggested actions, fault messages, recovery messages, and action lists.

After the intervention plan is executed, messages on proper actions are sent to an intervention manager. For example, action candidates can include: display a fault message on a status screen; send a message to pause the process before the next wafer; send a message to pause the process before the next lot; send a pause or stop message to one or more tools, send a pause or stop message to one or more process modules, send a pause or stop message to one or more sensors, and/or send an email to a system owner, tool owner, process owner. For example, a "stop" message can be used to tell the tool to continue processing the wafers already in the tool, and an "abort" message can be used to tell the tool not to process the wafers in the tool and to send them back to the carrier.

In some cases, the tool status monitoring system will be able to intervene and respond to a problem without human intervention. In other cases, human intervention will be required. For example, a user can access the data from the tool status monitoring system to determine the nature of the fault. The user can intervene, and the user can decide to continue with the lot or terminate it. If the user terminates the process, then a tool may enter a repair state. The user can trigger this from the tool screen. For example, a user can decide to do a chamber wet clean. After a wet clean, check, and process test, the process can resume with the next wafer.

During the execution of the intervention plan and analysis plan, the tool status monitoring system can present "tool health" charts to the user. For example, the charts can include manometer data, mass flow data, leakage data, pump data, gas system data, cassette system data, and/or transfer system data. The charts can display real-time data, historical data, and/or combination of real-time and historical data for one or more tools, one or more modules, one or more wafers, one or more process steps, and for different times.

In 240, a query can be performed to determined if the process has finished. When the process has finished, procedure 200 branches to 260, and procedure 200 ends. When the process has not finished, procedure 200 branches to 215, and procedure 200 continues as shown in FIG. 2.

The tool status monitoring system can be used to detect and classify tool errors when a tool is not in production; detect and classify tool errors during production; detect and correct tool errors during production; predict tool errors before production; and/or predict tool errors after production.

Figure 5:
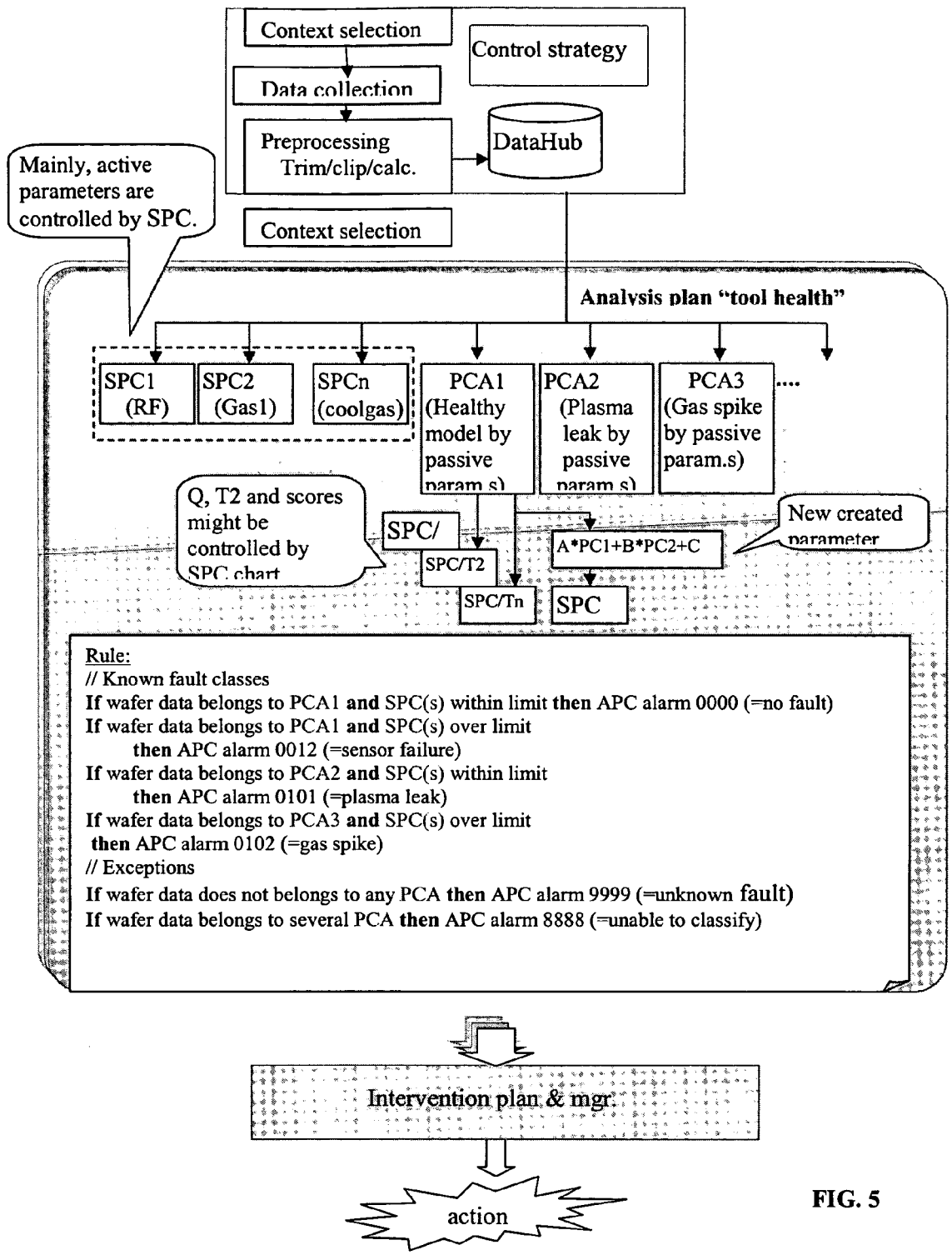
FIG. 5 shows an exemplary relationship diagram of an analysis plan/judgment plan for "tool health"

An exemplary relationship diagram of an analysis plan/judgment plan for "tool health" is shown in FIG. 5. As shown in FIG. 5, SPC plans can be executed, and PCA plans can be executed to obtain Q, T2, and score data.

The tool status monitoring system can use the PCA/PLS models or SPC charts to decide a fault class. For example, a PCA model can extract model setups from a table and calculate T2 and Q. A PLS model can extract model setups from another table and calculate predictable values. The SPC chart subroutine executes functions such as plot aver, sigma, max, min, and spikes of single parameters.

In the PLS model, the software calculates the Y value for the PLS model and plots the Y value on SPC chart. If the Y value reaches SPC alarm conditions, the software can send a message to perform a lot pause and can send an email. For example, a plasma leak can be detected using an SPC model, a PCA model, or a combination PCA_SPC model.

The tool status monitoring system can comprise strategies and plans that have been designed to monitor several different types of tools including cluster tools. For example, the tool status monitoring system can interface with processing tools which perform a number of self monitoring functions such as auto setup functions, auto check functions, and self check functions. For example, when the tool sends the machine events in real-time, the monitoring system monitors the data in real-time, and when the tool sends the data in non-real-time the monitoring system processes the data as soon as the tool sends the data (i.e. data stored in the machine logs). Tool data can include information such as leak-rate check, zero offset, history events, alarm information, and process log data.

The tool status monitoring system can comprise strategies, plans, and baseline models that can be used in generic fault detection and classification applications, chamber fingerprinting applications, seasoning completion applications, consumable life predictions, wet clean cycle applications, and the diagnostic applications for parts assembly.

The tool status monitoring system can comprise strategies, plans, and baseline models that can be used to collect and analyze autocheck logs, system logs, and machine logs from processing tools. In addition, the tool status monitoring system can collect and analyze the ARAMS (Automated Reliability, Availability and Maintainability Standards) logs from a processing tool. The tool status monitoring system can perform this data collection as a part of a data collection plan.

The tool status monitoring system can also perform dummy wafer data collection and any other process data collection that is necessary for analyzing data from the tool during times when the tool is being stabilized, monitored for processing, or during seasoning. Dummy wafers can be used during these types of processing to avoid loss of production wafers.

The tool status monitoring system can comprise strategies and plans for collecting and analyzing maintenance data. The data collection plans include consumable parts and maintainable parts. For example, these parts can include focus rings, shield rings, upper electrodes, etc.

Maintenance data strategies and plans are dependent on tool type, process module type and number, etc. Default maintenance data strategies and plans can be configured automatically as part of the tool setup, process module setup, and add-on sensor setup information. A user can change the default settings.

The tool status monitoring system can be used to provide wafer-to-wafer intervention, batch-to-batch intervention, or lot-to-lot intervention.

Figure 6A:
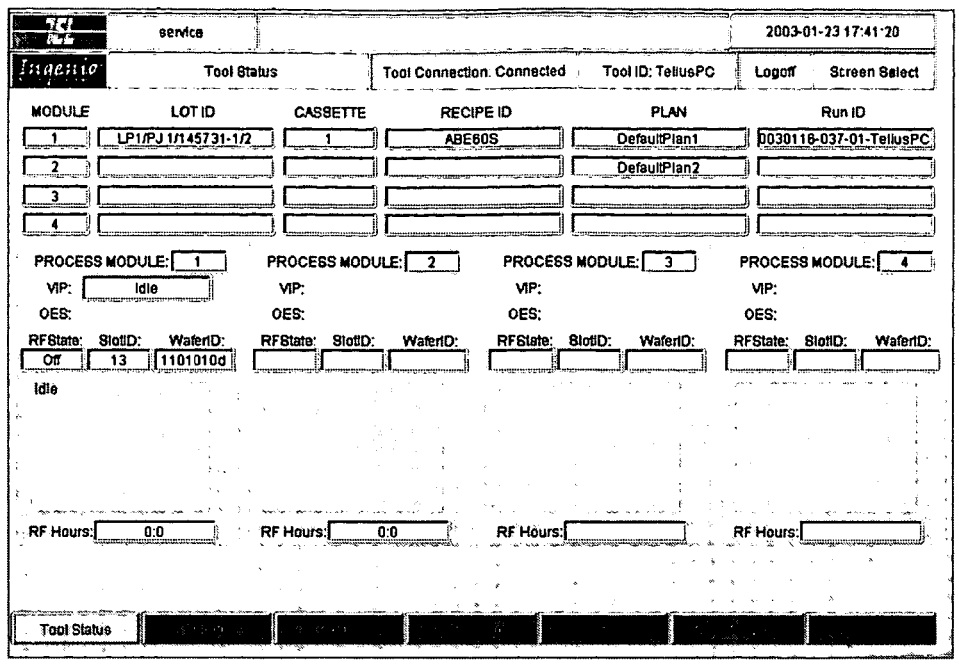
FIG. 6A shows a simplified view of a tool status screen in accordance with an embodiment of the present invention.

FIG. 6A shows a simplified view of a tool status screen in accordance with one embodiment of the present invention. In the illustrated embodiment, tool status screen 600 comprises title panel 610, information panel 650, and control panel 670.

In the illustrated embodiment, Title panel 610 can comprise the top two rows of the screen. Title panel 610 can comprise: a company logo field to display product and version information; a user ID field to display the ID of the current user; an alarm message field to display a message when there is an active alarm (otherwise, this field can be blank); a current date and time field to display the current date and time of the server; a current screen name field to display the name of the current screen (e.g., tool status); a communication status field to display the current status for a communications link between the server and tool; a tool ID field to display the ID of the tool being monitored; a logoff field to allow a user to log off; and/or a screen select field can be selected to view a list of all available screens.

Control panel 670 can comprise buttons along the bottom of the screen. These buttons enable the user to display the primary screens. The primary screen buttons are tool status, module, charts, alarm logs, SPC, data manager, and help. These buttons can be used from any screen.

Tool status can be used to view data for a specific tool. Module can be used to view data for a specific process module. Charts can be used to setup and view summary and trace charts. Alarm logs can be used to view a list of current alarms. SPC can be used to view process parameters on an SPC chart. Data manager can be used to configure data collection plans, and help can be used to display online help documentation. These buttons are conveniently displayed along the bottom of screens. These buttons provide a fast and convenient means for allowing a user to display the primary screens. In alternate embodiments, these buttons can be displayed in different languages and can be sized and positioned differently.

An information panel may include the central portion of the screen, and the content can be screen-specific. In information panel 650, current information can be displayed for each process module on this screen using subpanels.

Process module field can comprise at least one process module (process chamber) name. Information about the wafer currently in a process module can be displayed in the lot ID, cassette, recipe ID, and plan fields. Lot ID can be the ID of the lot to which the wafer in the process module belongs. Cassette can be the ID of the cassette from which the wafer came. Recipe ID can be the ID of the recipe for the current wafer. Plan can be the name of the data collection plan executed on the current wafer.

A user can view a tool status screen such as shown in FIG. 6A to ensure that a diagnostic wafer is being processed during a diagnostic data collection plan. For example, a user can verify that the proper process module is being used, the correct recipe is being used, and the probes are recording data.

To view additional information on process module status, a user can right click on the desired process module in the tool status screen 650, or click the module button in control panel 670, then click on the desired process module in the dialog box, not shown. The process module status screen displays data about a specific process module.

Figure 6B:
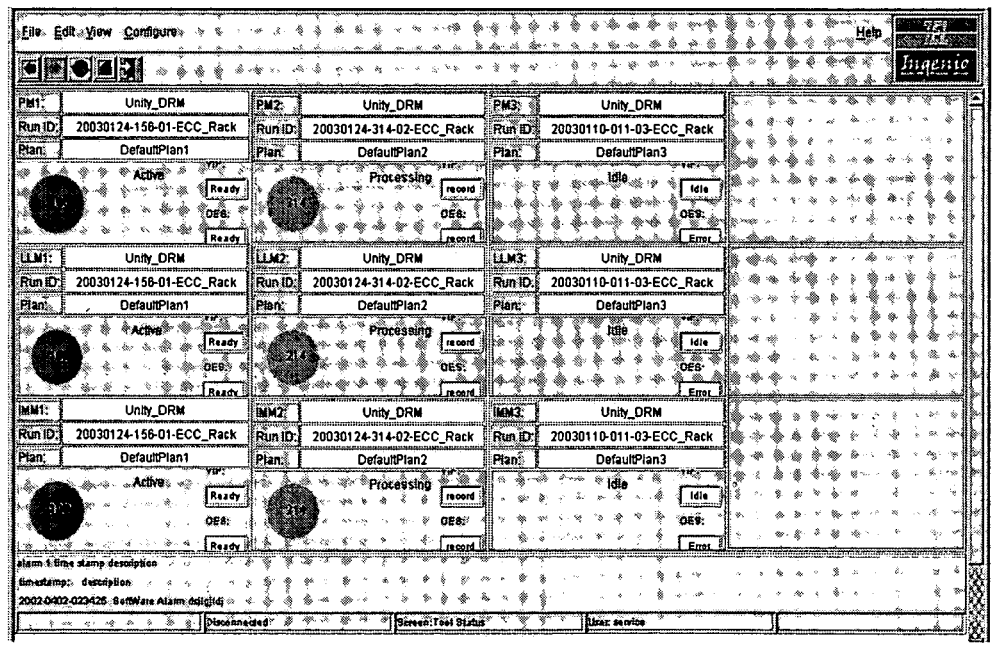
FIG. 6B shows another simplified view of a tool status screen in accordance with another embodiment of the present invention.

FIG. 6B shows another simplified view of a tool status screen in accordance with another embodiment of the present invention. In the illustrated embodiment, tool status screen 600' comprises title panel 610', and information panel 650'.

In the illustrated embodiment, title panel 610' can comprise the top two rows of the screen. Title panel 610' can comprise: a company logo field to display product and version information; a set of selection items, a set of navigation items, and a help item.

An information panel may include the central portion of the screen, and the content can be screen-specific. In information panel 650', current information can be displayed for a number of process modules on this screen using subpanels.

Sub panels can be used to display data for each process module. Information about the wafer currently in a process module can be displayed in the PM, run ID, and plan fields. For example, PM can be the process module name; run ID can be the ID of the recipe for the current wafer; and plan can be the name of the data collection plan executed on the current wafer.

A user can view a tool status screen such as shown in FIG. 6B to ensure that a diagnostic wafer is being processed during a diagnostic data collection plan. For example, a user can verify that the proper process module is being used, the correct recipe is being used, and the probes are recording data.

FIG. 7A shows a simplified view of a selection screen in accordance with one embodiment of the present invention. In the illustrated embodiment, selection screen 700 comprises title panel 710, information panels 750 and 760, and control panel 770. A user can use a selection screen such as illustrated to create, edit, and view tool-related strategies and plans.

In the illustrated embodiment, a navigation tree is shown, but this is not required for the invention. Alternately, other selection means can be used such as selection tabs or buttons. The first level shown in FIG. 7A is the tool level, but this is not required for the invention. Alternately, a system level or other higher-level group can be shown. For example, a tool level can be associated with an etching tool, a deposition tool, a cleaning tool, a transfer tool, an alignment tool, an inspection tool, a measurement tool, a temperature controlled tool, a developer tool, a lithography tool, a metrology tool, an ODP tool, or other semiconductor processing tool. In addition, selection means are available that allow a user to display a "tool status" screen as shown in FIG. 6A. For example, a selection list can be displayed using a mouse button or a sequence of keystrokes.

The next level shown is a process module level. A user can open a tool level folder to display the status for a process module level. For example, FIG. 7A shows an opened tool level folder labeled as "TeliusPC" and four process module folders labeled as "process module 1" through "process module 4". A user can open a process module folder to display the status for the strategies associated with a particular process module.

The next level shown is a strategy level. A user can open a process module level folder to display the status for a strategy level. For example, FIG. 7A shows an opened process module level folder labeled as "process module 1" and two strategy folders labeled as "data collection strategy" and "analysis strategy". A user can open a strategy folder to display the status for the context and plans associated with a particular strategy.

A control (data collection) strategy folder can be opened to display a list of data collection strategies. In the illustrated embodiment, a single control strategy can be shown along with the context and plans associated with a control strategy. Context can be used to invoke the specific data collection plans that are required for a particular item, such as a dummy or diagnostic wafer.

A particular data collection plan folder, such as "defaultplan1" can be opened to display a "data collection plan" folder that can be opened to display a data collection plan name. In FIG. 7A, a single data collection plan name "defaultplan1" is displayed, and selection means are available that allow a user to display additional tool status monitor system screens. For example, a selection list can be displayed using a mouse button or a sequence of keystrokes.

A data collection strategy has an associated data collection plan that describes how the sensors should be configured, and which observation parameters should be collected. A data collection strategy can also be associated with a preprocessing plan. A preprocessing plan describes how the expected observation parameters are to be processed with respect to spike counting, step trimming, high clip and low clip limits. This configuration affects the step summary output data that can be created. There can be multiple strategies that match a run context. The user determines the order of the strategies within a specific context by moving the strategies up or down on the list. When the time comes for the strategy to be selected, the software starts at the top of the list and goes down the list until it finds the first strategy that matches the requirements determined by the context.

In addition, an "analysis strategy" folder can be opened to display a list of analysis strategies. In the illustrated embodiment, a single analysis strategy is shown along with the context associated with the analysis strategy. Context can be used to invoke the specific analysis strategies and plans that are required for a particular item, such as a wafer. Analysis plans can include SPC plans, PCA SPC plans, PLS SPC plans, MVA plans, and FDC plans.

A particular analysis plan folder, such as "SPC plans" can be opened to display a particular data collection plan name and the context associated with the plan folder that can be opened to display a data collection plan name.

Analysis strategies determine how the data are presented after a processing step has been completed. The analysis strategy can be associated with a several analysis plans. A single analysis strategy can execute multiple analysis plans.

FIG. 7B shows another simplified view of a selection screen in accordance with another embodiment of the present invention. In the illustrated embodiment, selection screen 700' comprises title panel 710' and information panels 750' and 760'. A user can use a selection screen such as illustrated to create, edit, and view tool-related strategies and plans.

In the illustrated embodiment, a number of navigation trees are shown, but this is not required for the invention. Alternately, other selection means can be used such as selection tabs or buttons. The first level shown in FIG. 7B is the tool level, but this is not required for the invention. Alternately, a system level or other higher-level group can be shown. For example, a tool level can be associated with an etching tool, a deposition tool, a cleaning tool, a transfer tool, an alignment tool, an inspection tool, a measurement tool, a temperature controlled tool, a developer tool, a lithography tool, a metrology tool, an ODP tool, or other semiconductor processing tool. In addition, selection means are available that allow a user to display a "tool status" screen as shown in FIG. 6B. For example, a selection list can be displayed using a mouse button or a sequence of keystrokes.

The next level shown is a process module level. A user can open a tool level folder to display the status for a process module level. For example, FIG. 7B shows several opened tool level folders. A user can open a process module folder to display the status for the strategies associated with a particular process module.

The next level shown is a strategy level. A user can open a process module level folder to display the status for a strategy level. For example, FIG. 7B shows several opened process module level folders and several strategy level folders that can be data collection strategy folders and analysis strategy folders. A user can open a strategy folder to display the status for the context and plans associated with a particular strategy.

A control (data collection) strategy folder can be opened to display a list of data collection strategies. Data collection strategies can be shown along with the context and plans associated with a control strategy. Context can be used to invoke the specific data collection plans that are required for a particular item, such as a dummy or diagnostic wafer.

A data collection strategy has an associated data collection plan that describes how the sensors should be configured, and which observation parameters should be collected. A data collection strategy can also be associated with a preprocessing plan. A preprocessing plan describes how the expected observation parameters are to be processed with respect to spike counting, step trimming, high clip and low clip limits. This configuration affects the step summary output data that can be created. There can be multiple strategies that match a run context. The user determines the order of the strategies within a specific context by moving the strategies up or down on the list. When the time comes for the strategy to be selected, the software starts at the top of the list and goes down the list until it finds the first strategy that matches the requirements determined by the context.

In addition, an "analysis strategy" folder can be opened to display a list of analysis strategies. In the illustrated embodiment, a single analysis strategy is shown along with the context associated with the analysis strategy. Context can be used to invoke the specific analysis strategies and plans that are required for a particular item, such as a wafer. Analysis plans can include SPC plans, PCA SPC plans, PLS SPC plans, MVA plans, and FDC plans.

A particular analysis plan folder, such as "SPC plans" can be opened to display a particular data collection plan name and the context associated with the plan folder that can be opened to display a data collection plan name.

Analysis Strategies determine how the data are presented after a processing step has been completed. The analysis strategy can be associated with a several analysis plans. A single analysis strategy can execute multiple analysis plans.

Figure 8A:
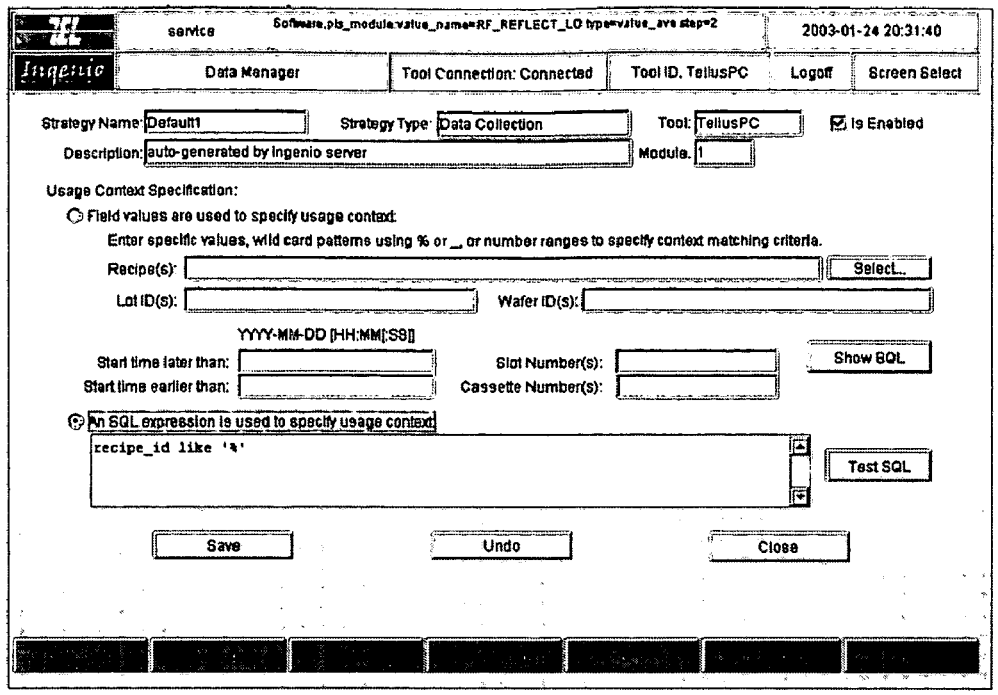
FIG. 8A shows a simplified view of a strategy configuration screen in accordance with one embodiment of the present invention.

FIG. 8A shows a simplified view of a strategy configuration screen in accordance with one embodiment of the present invention. For example, strategy configuration screen can be accessed through a selection screen such as shown in FIG. 7A. Such a strategy configuration screen may be used to create a tool health control strategy discussed above. In the illustrated embodiment, an exemplary data collection strategy configuration screen is shown.

Approved and qualified users may be allowed to edit a strategy configuration screen. This prevents problems such as loss of data or a system crash from occurring. For example, only administrators or qualified users can edit the control strategy configuration. Generally, the data collection strategies are configured when the tool status monitoring system and/or the APC system is installed.

For example, a data collection strategy configuration screen can comprise: a strategy name field which can be used to enter or edit strategy information such as a name; a strategy type field which can be used to display a strategy type such as data collection; an Is_enable field which can be used to select or deselect a strategy; a tool field which can be used to display tool information such as a name; a module field can be used to display module information; and a description field for describing a strategy. In addition, a strategy configuration screen can comprise a usage context specification portion, which provides options that allow a user to select the usage context for the control strategy. Furthermore, a strategy configuration screen can comprise recipe(s) field that displays the process recipe; a select button that allows the user to select a process recipe; lot ID(s) field that displays the lot ID; wafer ID(s) field that displays the wafer ID; start time later than field that displays the start date for viewing processed wafer runs; start time earlier than field that displays the end date for viewing processed wafer runs; slot number(s) field that displays the slot number for the selected wafer; cassette number(s) field that displays the cassette number for the selected wafer. Finally, a strategy configuration screen can comprise a number of buttons including at least one of a show SQL button, a test SQL button, a save button, and a close button.

An exemplary screen is shown for a data collection strategy named "default1", but this is not required for the invention. Alternately, a different strategy can be shown. For example, a user can use a strategy configuration screen to create, edit, and/or view a data collection strategy information and context information for a new operation on a processing tool.

Figure 8B:
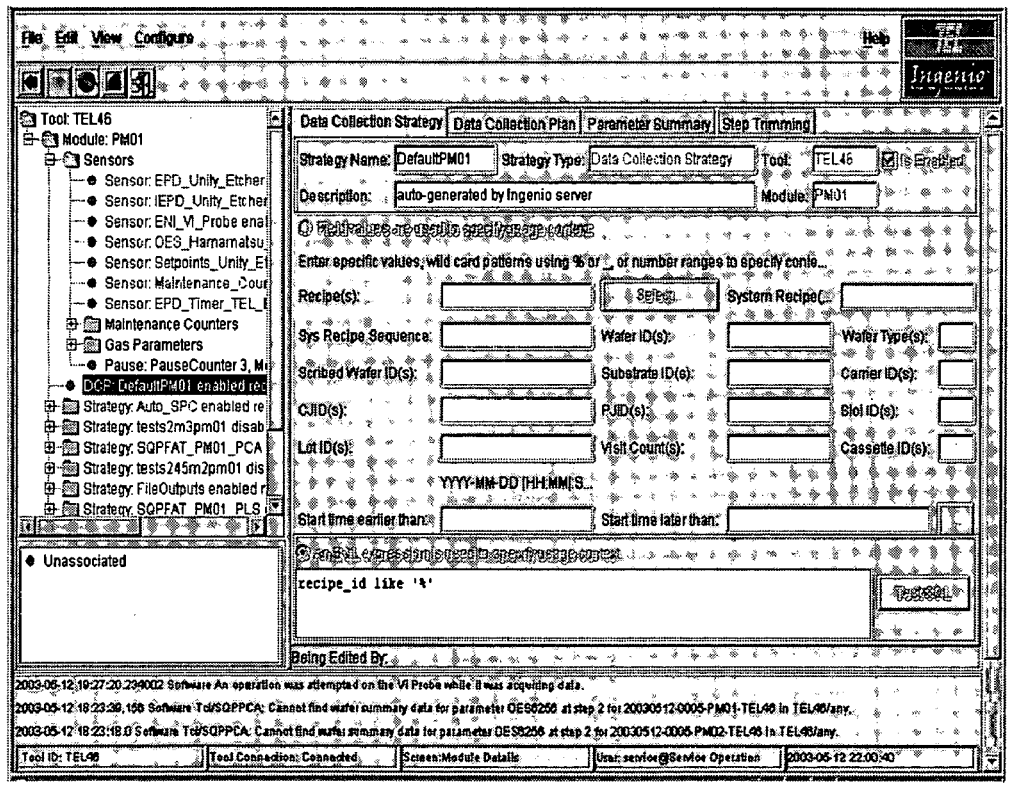
FIG. 8B shows a simplified view of another strategy configuration screen in accordance with another embodiment of the present invention.

FIG. 8B shows a simplified view of another strategy configuration screen in accordance with another embodiment of the present invention. For example, strategy configuration screen can be accessed through a navigation tree. Such a strategy configuration screen may be used to create a tool health control strategy discussed above. In the illustrated embodiment, an exemplary data collection strategy configuration screen is shown.

For example, a data collection strategy configuration screen can comprise: a strategy name field which can be used to enter or edit strategy information such as a name; a strategy type field which can be used to display a strategy type such as data collection; an Is_enable field which can be used to select or deselect a strategy; a tool field which can be used to display tool information such as a name; a module field can be used to display module information; and a description field for describing a strategy. In addition, a strategy configuration screen can comprise a Usage context specification portion, which provides options that allow a user to select the usage context for the control strategy. Furthermore, a strategy configuration screen can comprise Recipe(s) field that displays the process recipe; a select button that allows the user to select a process recipe; lot ID(s) field that displays the lot ID; wafer ID(s) field that displays the wafer ID; start time later than field that displays the start date for viewing processed wafer runs; start time earlier than field that displays the end date for viewing processed wafer runs; slot number(s) field that displays the slot number for the selected wafer; cassette number(s) field that displays the cassette number for the selected wafer. Finally, a strategy configuration screen can comprise a number of selection tabs including at least one of a data collection strategy tab, a data collection plan tab, a parameter summary tab and a step trimming tab for accessing different screens for configuring and editing a data collection strategy associated with a tool status monitoring operation or another operation.

An exemplary screen is shown for a data collection strategy named "DefaultPM01", but this is not required for the invention. Alternately, a different strategy can be shown. For example, a user can use a strategy configuration screen to create, edit, and/or view a data collection strategy information and context information for a new operation on a processing tool.

Figure 9A:
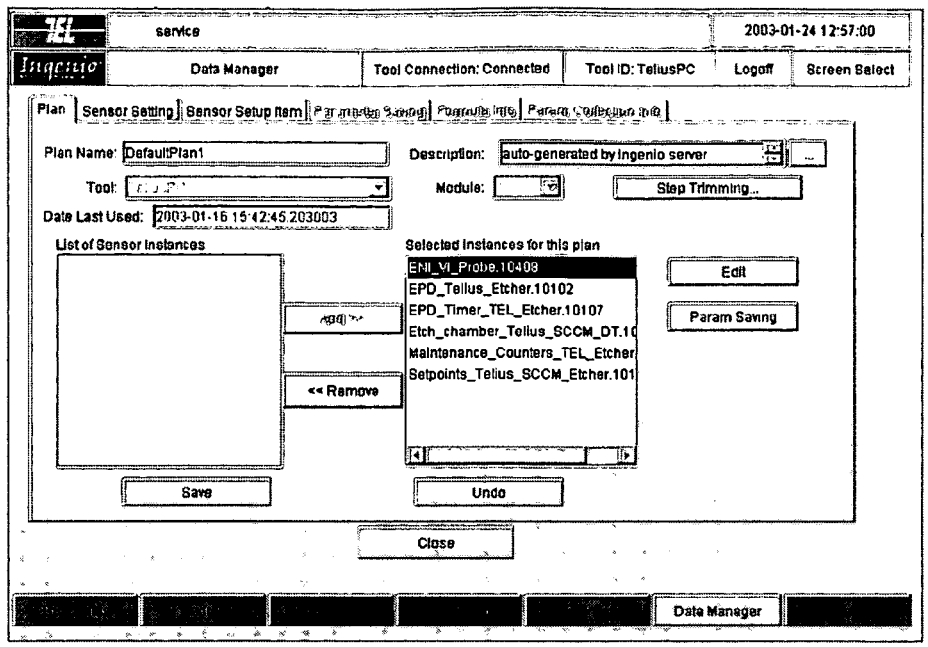
FIG. 9A shows an exemplary view of a data collection plan screen in accordance with one embodiment of the present invention.

FIG. 9A shows an exemplary view of a data collection plan screen in accordance with one embodiment of the present invention. Such a data collection plan screen may be used to create a tool health data collection plan as discussed above. A user can access a tool status monitoring screen to create, edit, and/or view a tool status related data collection plan. The DC plan screen allows users to view a list of available plans and verify that the correct data collection plan has been selected.

A user can use the tool status monitoring system screens, such as the DC plan screen, to determine the configuration status of the sensors, the configuration status of the data items to be collected by the associated sensors, and the status of the data items that are to be saved. The tool status monitoring screens also include means for reviewing the status for the data pre-processing functions such as step trimming, low clip, high clip, and limit values for the collected parameters.

Figure 9B:
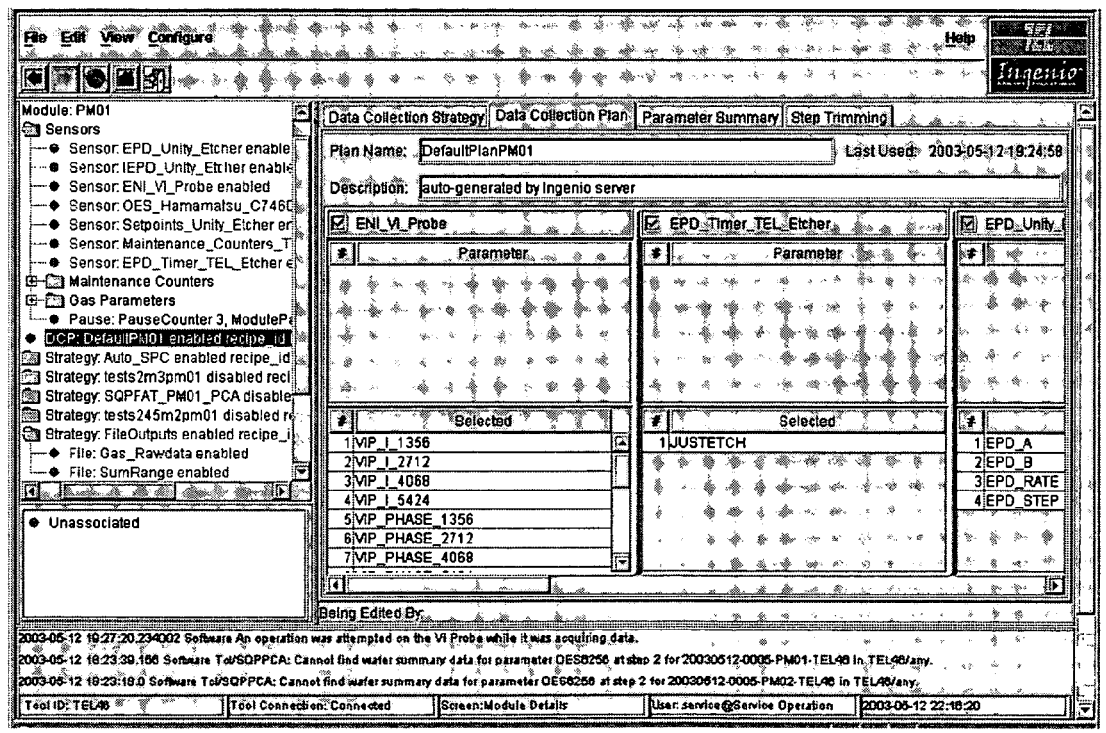
FIG. 9B shows an exemplary view of another data collection plan screen in accordance with another embodiment of the present invention.

FIG. 9B shows an exemplary view of another data collection plan screen in accordance with another embodiment of the present invention. Such a data collection plan screen may also be used to create a tool health data collection plan as discussed above. A user can access a tool status monitoring screen such as shown in FIG. 9B to create, edit, and/or view a tool status related data collection plan. The DC plan screen allows users to view a list of available plans and verify that the correct data collection plan has been selected.

A user can use the tool status monitoring system screens, such as the DC plan screen, to determine the configuration status of the sensors, the configuration status of the data items to be collected by the associated sensors, and the status of the data items that are to be saved. The tool status monitoring screens also include means for reviewing the status for the data pre-processing functions such as step trimming, low clip, high clip, and limit values for the collected parameters.

Figure 10A:
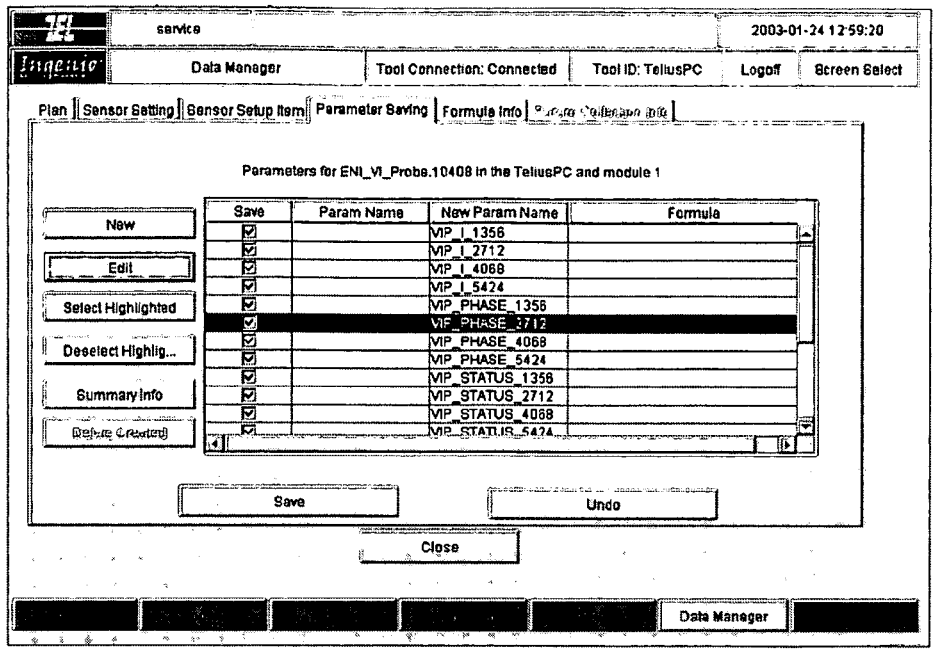
FIG. 10A shows an exemplary view of a parameter saving screen in accordance with one embodiment of the present invention.
Figure 10B:
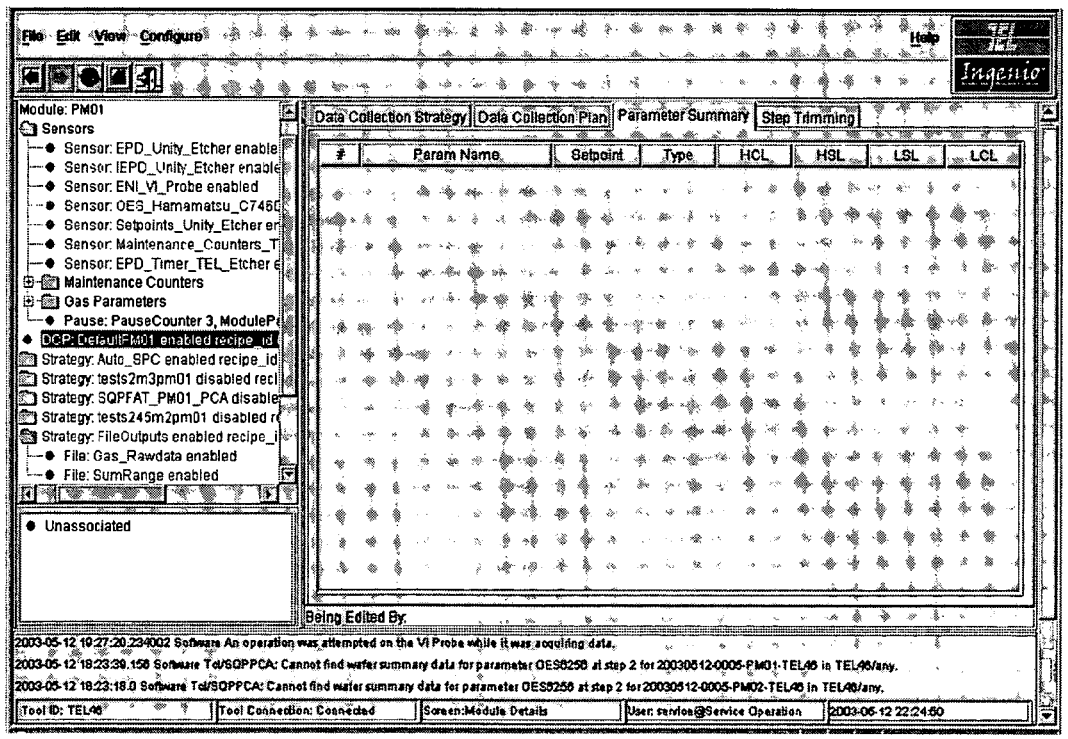
FIG. 10B shows an exemplary view of another parameter saving screen in accordance with another embodiment of the present invention.

FIG. 10A shows an exemplary view of a parameter saving screen in accordance with one embodiment of the present invention. FIG. 10B shows an exemplary view of another parameter saving screen in accordance with another embodiment of the present invention. A user can access a monitor system screen such as one of the parameter saving screens (FIG. 10A and FIG. 10B) to review the parameters that are being saved in a tool status monitoring related data collection plan.

A parameter saving screen can show a list of parameters for a selected sensor instance in a selected data collection plan. The database save plan can provided a link to each parameter in the parameter saving screen. A parameter saving screen can comprise a list of items for the selected sensor including the selected sensor setup item's name. A parameter saving screen also can comprise a number of selection items that allow a user to create and to edit the sensor information.

Figure 11A:
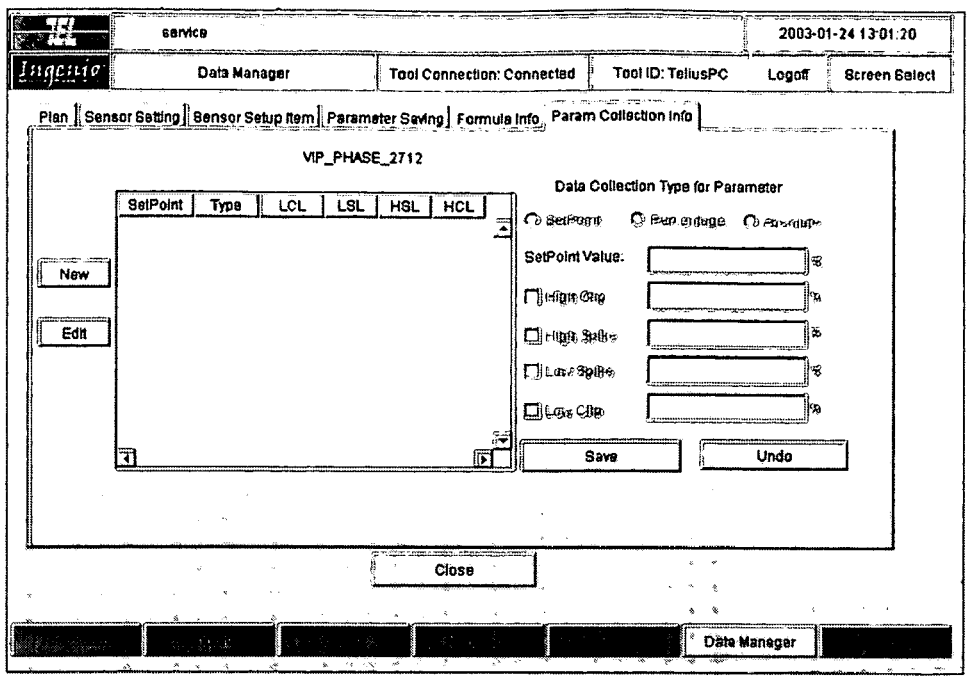
FIG. 11A shows an exemplary view of a parameter information screen in accordance with one embodiment of the present invention.
Figure 11B:
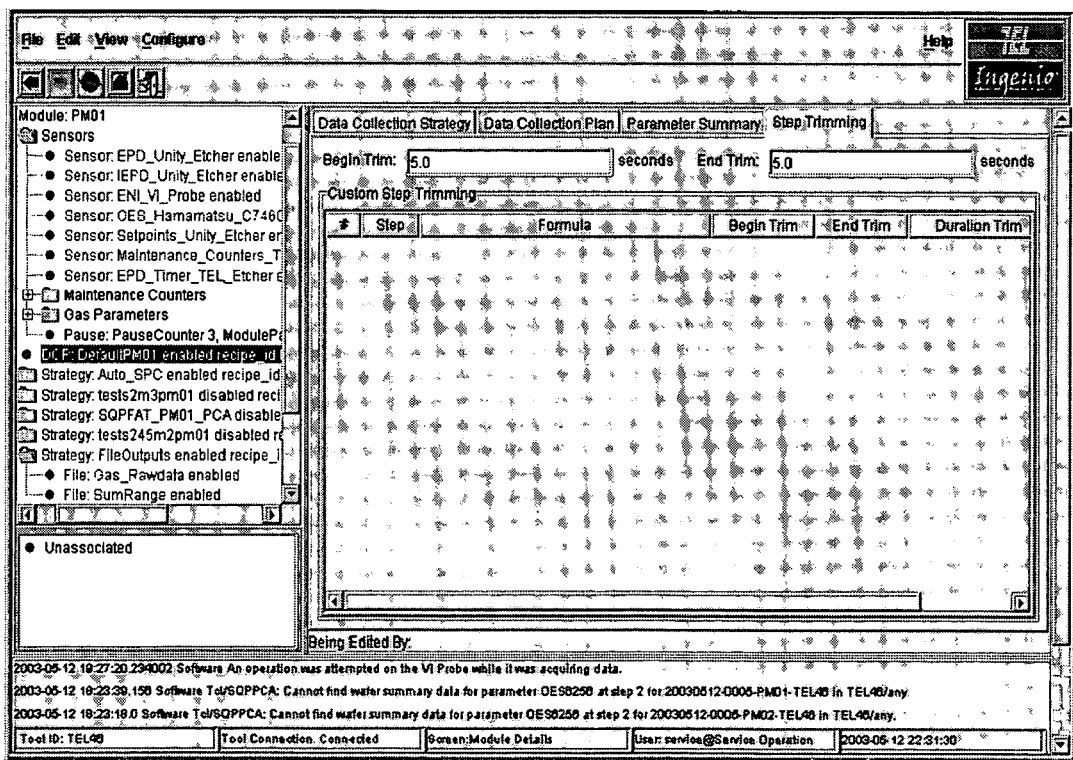
FIG. 11B shows an exemplary view of another parameter information screen in accordance with another embodiment of the present invention.

FIG. 11A shows an exemplary view of a parameter information screen in accordance with one embodiment of the present invention. FIG. 11B shows an exemplary view of another parameter information screen in accordance with another embodiment of the present invention. A user can access a tool status monitoring system screen such as the parameter information screens shown in FIG. 11A and FIG. 11B to review how the parameters that are being saved in a tool status monitoring related data collection plan are being pre-processed. For example a parameter information screen can comprise a name field that displays the selected parameter name. A user can verify that the proper items are selected for a particular parameter.

Figure 12A:
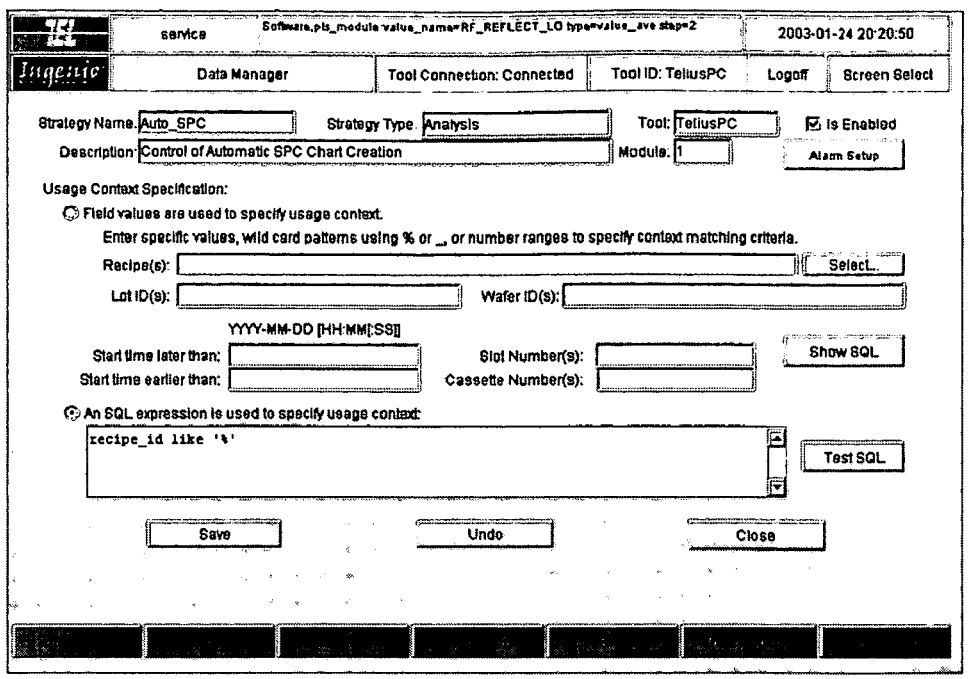
FIG. 12A shows a simplified view of a configuration screen for an analysis strategy in accordance with one embodiment of the present invention.
Figure 12B:
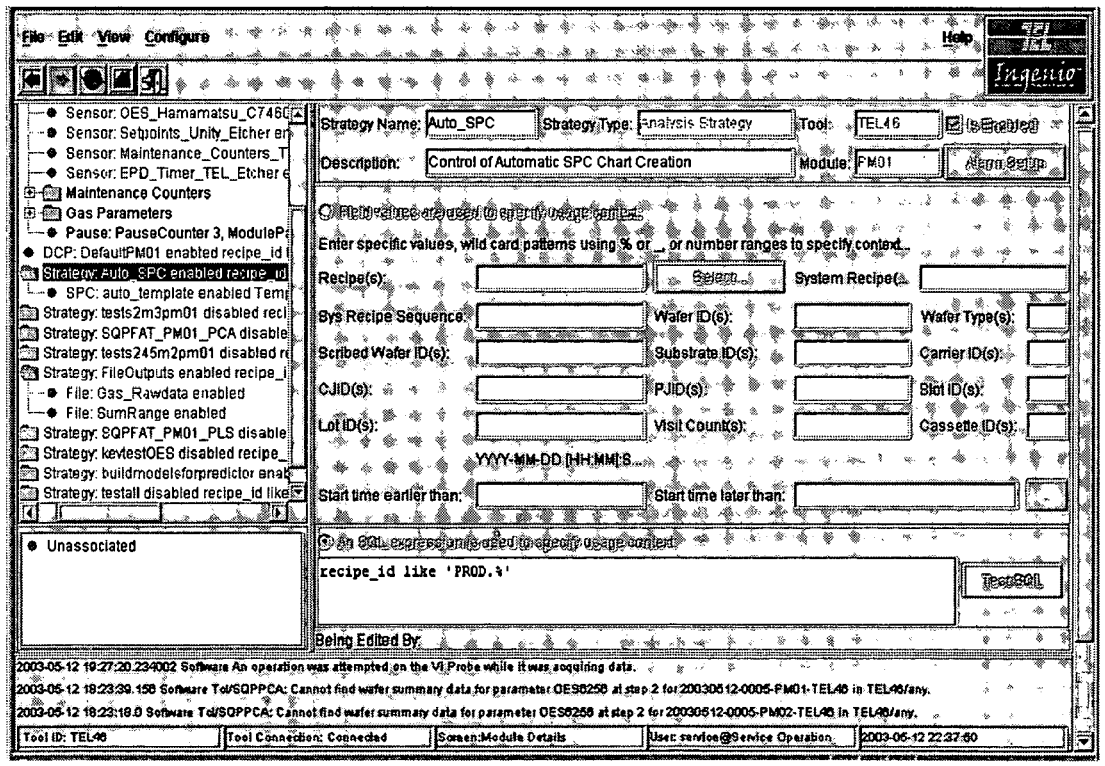
FIG. 12B shows a simplified view of another configuration screen for an analysis strategy in accordance with another embodiment of the present invention.

FIG. 12A shows a simplified view of a configuration screen for an analysis strategy in accordance with an embodiment of the present invention. FIG. 12B shows a simplified view of another configuration screen for an analysis strategy in accordance with another embodiment of the present invention. In the illustrated embodiments, an exemplary "auto_APC" analysis strategy is shown.

Approved and qualified users may be allowed to edit an analysis strategy using a strategy configuration screen such as shown in FIG. 12A or FIG. 12B. This prevents problems such as loss of data or a system crash from occurring. For example, only administrators or qualified users can edit an analysis strategy configuration. Generally, the analysis strategies are configured when the tool status monitoring system and/or the APC system is installed.

For example, an analysis strategy configuration screen can comprise: a Strategy name field which can be used to enter or edit strategy information such as a name; a strategy type field which can be used to display a strategy type such as analysis; an Is_enable field which can be used to select or deselect a strategy; a tool display field which can be used to display tool information such as a name; a module display field can be used to display module information; and a description field for describing a strategy. In addition, a strategy configuration screen can comprise a usage context specification portion, which provides options that allow a user to select the usage context for the analysis strategy. Furthermore, a strategy configuration screen can comprise Recipe(s) field that displays the process recipe; a select button that allows the user to select a process recipe; lot ID(s) field that displays the lot ID; wafer ID(s) field that displays the wafer ID; start time later than field that displays the start date for viewing processed wafer runs; start time earlier than field that displays the end date for viewing processed wafer runs; slot number(s) field that displays the slot number for the selected wafer; cassette number(s) field that displays the cassette number for the selected wafer. In one case, an analysis strategy configuration screen can comprise a number of buttons including at least one of an alarm setup button, a select button, a show SQL button, a test SQL button, a save button, and a close button.

Figure 13A:
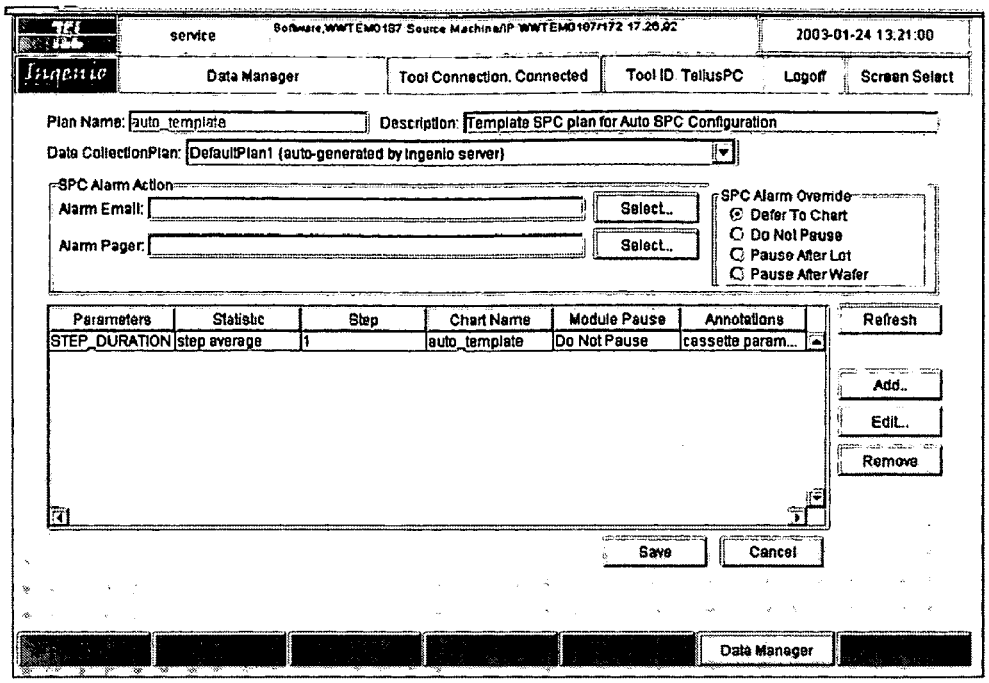
FIG. 13A shows an exemplary view of a first embodiment of a plan editor screen in accordance with the present invention.
Figure 13B:
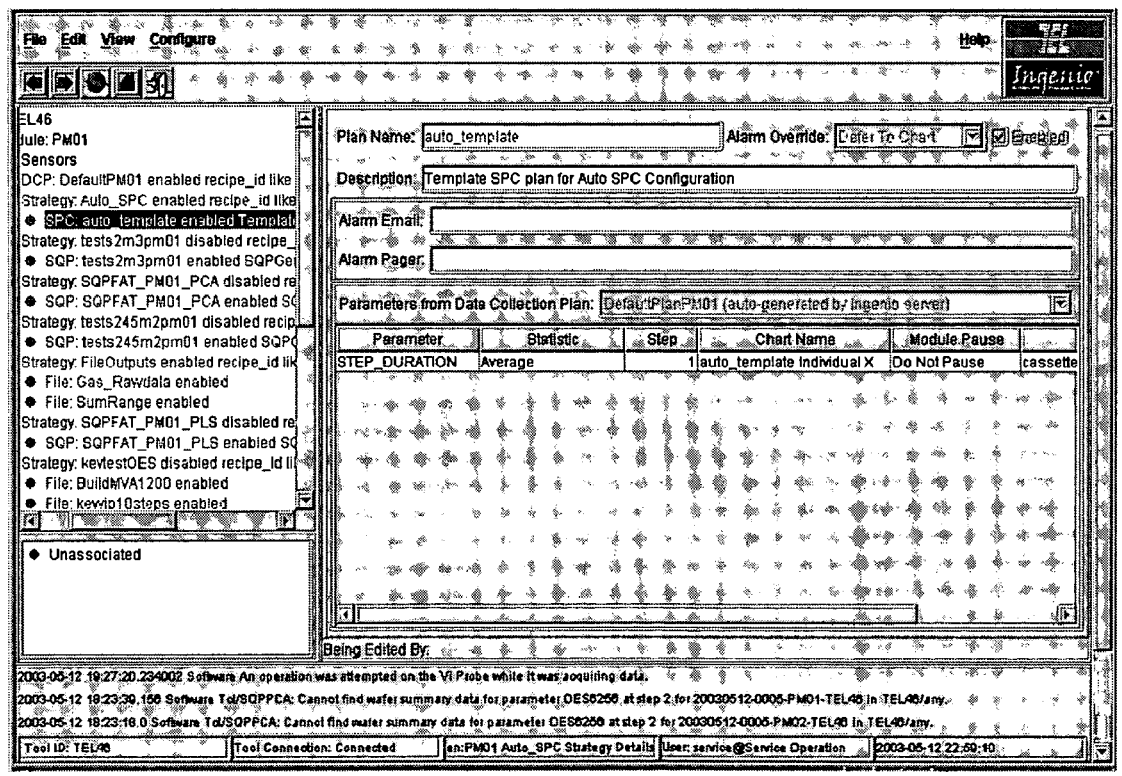
FIG. 13B shows an exemplary view of a second embodiment of a plan editor screen in accordance with the present invention.

FIG. 13A shows an exemplary view of a first embodiment of a plan editor screen in accordance with the present invention. FIG. 13B shows an exemplary view of a second embodiment of a plan editor screen in accordance with the present invention. One such plan editor screen may be used to create a tool health analysis plan as discussed above. In the illustrated embodiment, a SPC plan editor screen is shown for a SPC plan, but this is not required for the invention. Alternately, a different type plan can be used. A user can use a tool status monitoring screen such as a SPC plan editor screen to create, edit, and/or review the information associated with a SPC "analysis" plan for a processing tool.

For example, a SPC plan editor screen can comprise a name field, a description field, and a data collection plan field that shows the name of the DC plan data source file. A user can verify that the proper items are selected for a particular SPC plan. In addition, a SPC plan editor screen can comprise and SPC alarm action information area. For example, a SPC alarm action information area can include an alarm email field, an alarm pager field, and an SPC alarm override field. A user can use the alarm email field to verify that an email is being sent to the correct recipient(s). A user can use the alarm pager field to verify that a page is being sent to the correct recipient(s). A user can use the SPC alarm override field to verify that the correct alarm message response level is being sent to the intervention manager for this processing tool when this plan is executed.

Figure 14A:
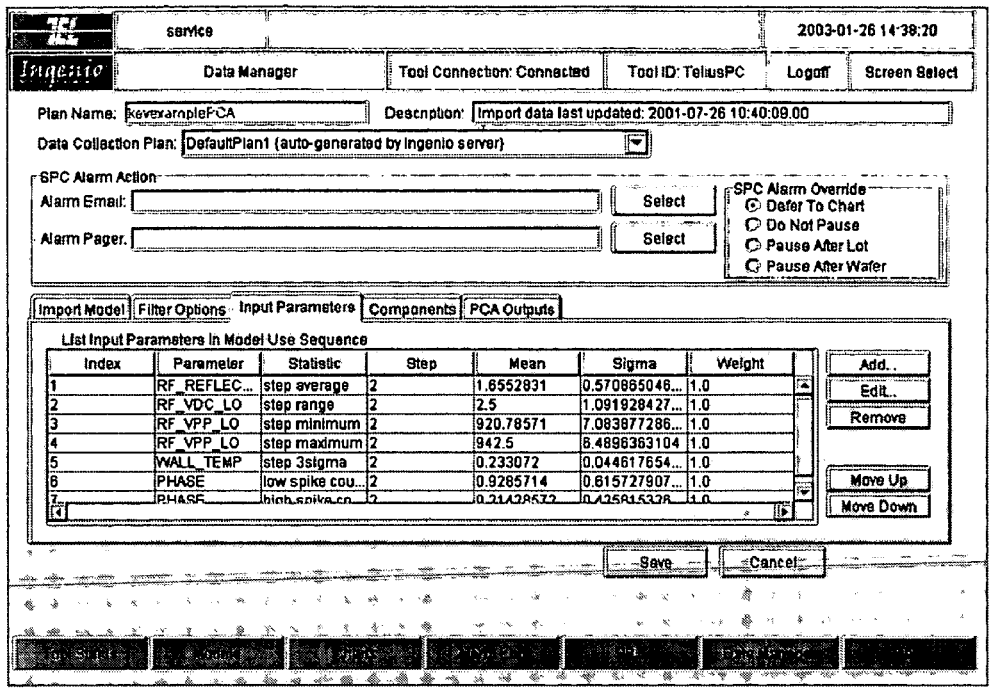
FIG. 14A shows an exemplary view of a third embodiment of a plan editor screen in accordance with the present invention.
Figure 14B:
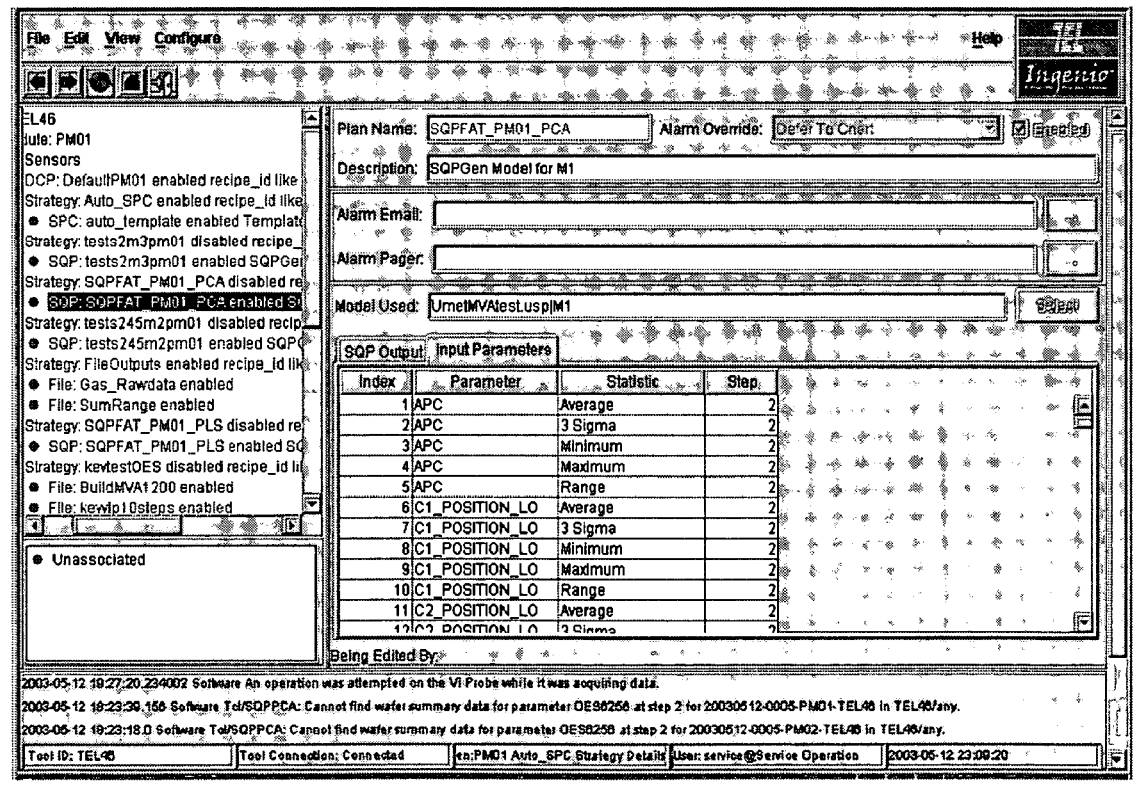
FIG. 14B shows an exemplary view of a fourth embodiment of a plan editor screen in accordance with the present invention.

FIG. 14A shows an exemplary view of a third embodiment of a plan editor screen in accordance with the present invention. FIG. 14B shows an exemplary view of a fourth embodiment of a plan editor screen in accordance with the present invention. In the illustrated embodiment, a PCA plan editor screen is shown for a PCA plan, but this is not required for the invention. Alternately, a different PCA plan can be used. A user can use a tool status monitoring screen such as a PCA plan editor screen to create, edit, and/or review the information associated with a PCA "analysis" plan for a processing tool.

For example, a PCA plan editor screen can comprise a name field, a description field, and a data collection plan field that shows the name of the DC plan data source file. A user can verify that the proper items are selected for a particular PCA plan. In addition, a PCA plan editor screen can comprise and SPC alarm action information area. For example, a SPC alarm action information area can include an alarm email field, an alarm pager field, and an SPC alarm override field. A user can use the alarm email field to verify that an email is being sent to the correct recipient(s). A user can use the alarm pager field to verify that a page is being sent to the correct recipient(s). A user can use the SPC alarm override field to verify that the correct alarm message response level is being sent to the intervention manager for this processing tool when this plan is executed.

Figure 15A:
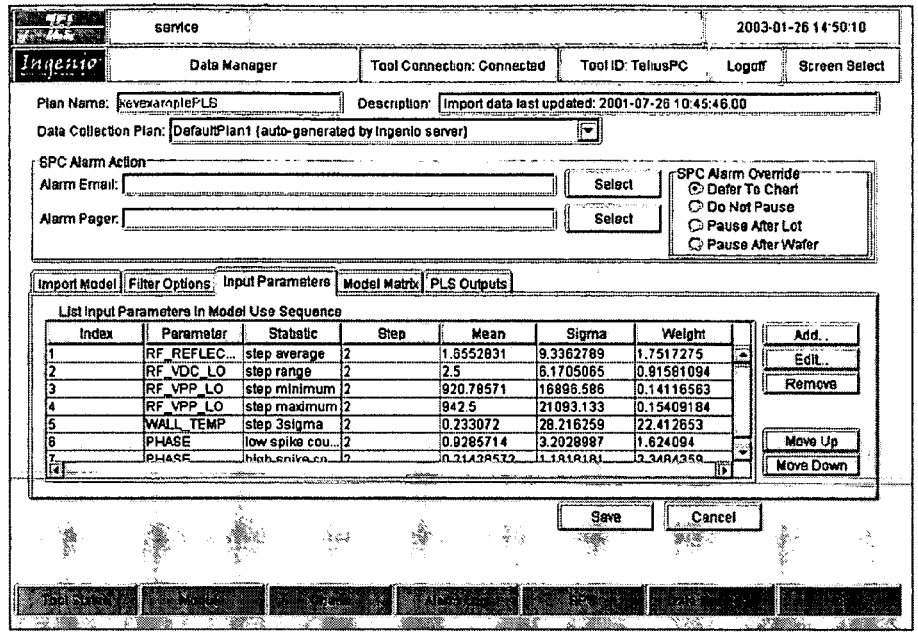
FIG. 15A shows an exemplary view of a fifth embodiment of a plan editor screen in accordance with the present invention.
Figure 15B:
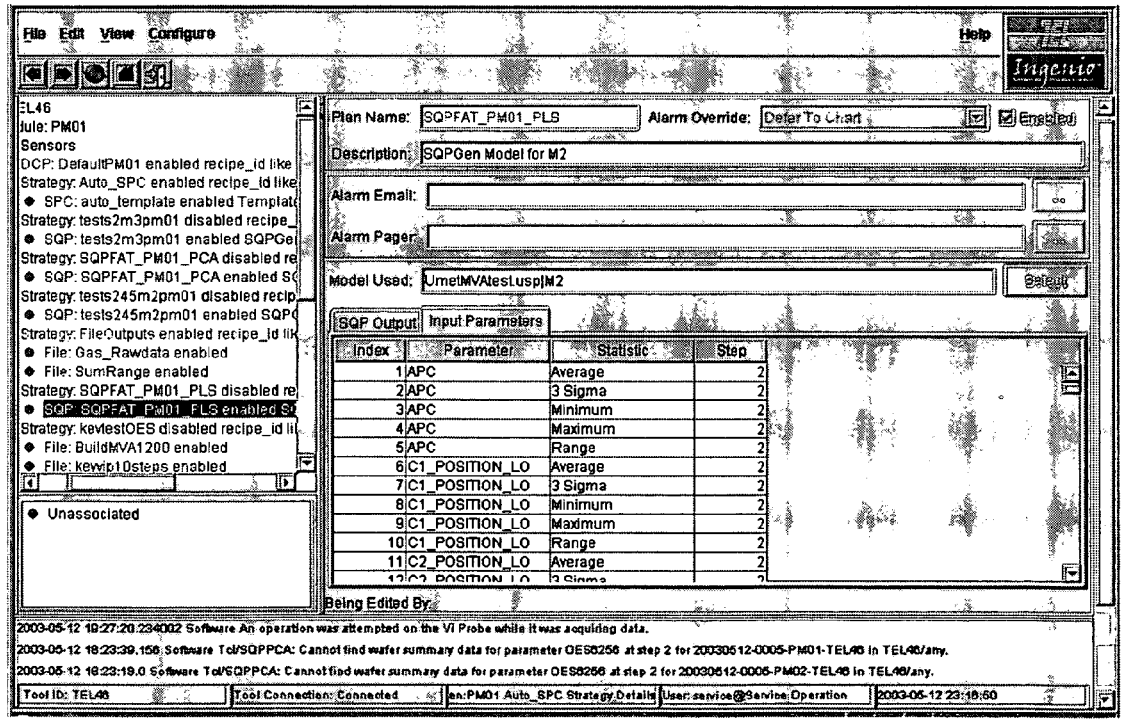
FIG. 15B shows an exemplary view of a sixth embodiment of a plan editor screen in accordance with the present invention.

FIG. 15A shows an exemplary view of a fifth embodiment of a plan editor screen in accordance with the present invention. FIG. 15B shows an exemplary view of a sixth plan editor screen in accordance with the present invention. In the illustrated embodiment, a PLS plan editor screen is shown for a PLS plan, but this is not required for the invention. Alternately, a different PLS plan can be used. A user can use a tool status monitoring screen such as a PLS plan editor screen to create, edit, and/or review the information associated with a PLS "analysis" plan for a processing tool.

For example, a PLS plan editor screen can comprise a name field, a description field, and a data collection plan field that shows the name of the DC plan data source file. A user can verify that the proper items are selected for a particular PLS plan. In addition, a PLS plan editor screen can comprise and SPC alarm action information area. For example, a SPC alarm action information area can include an alarm email field, an alarm pager field, and an SPC alarm override field. A user can use the alarm email field to verify that an email is being sent to the correct recipient(s). A user can use the alarm pager field to verify that a page is being sent to the correct recipient(s). A user can use the SPC alarm override field to verify that the correct alarm message response level is being sent to the intervention manager for this processing tool when this plan is executed.

When an SPC value, a PCA value, or a PLS value is out of specified limits, an alarm can be stored in a database, an e-mail or page can be sent to a predefined list of recipient(s), and an alarm can be displayed on a GUI screen such as a tool status screen. A pause/stop command can also be sent to the tool by the tool status monitoring system along with the alarm message. For example, if an alarm is judged to be severe (i.e., immediate tool action required), then a "stop" command can be sent to a processing tool; if an alarm is judged to be less than severe (i.e., immediate tool action not required), then a "pause" command can be sent to a processing tool, if an alarm is judged to have a warning level, then a command does not have to be sent to the processing tool A SPC plan, a PCA plan, and/or a PLS plan can be executed as part of a maintenance strategy. For example, one or more of these plans can be executed when a processing tool is in a maintenance mode and a seasoning process is being run. One or more of these plans can be used to determine when the seasoning process is completed. One or more of these plans can also be used to determine when the seasoning process has not completed as planned. In addition, at least one of these plans can be used to determine when a fingerprinting process is completed. At least one plan can also be used to determine when the fingerprinting process has not completed as planned.

The pause choices shown on the plan editor screens are: Defer to Chart—the plan does not send a message; Do Not Pause—the plan sends a "do not pause" message; Pause After Lot—the plan sends a "pause after lot" message; and Pause After Wafer—the plan sends a "pause after wafer" message.

The tool status monitoring system is flexible and configurable. For example, customer dependent information like IP address, tool id, etc. does not affect the monitoring software configurability. Once the system is configured, the information is usable at the next start up. The tool status monitoring system software can operate under several different operating systems such as Windows NT and Windows 2000.

Reminder messages can be provided when data has been modified and not saved. In addition, a Help button can be displayed, and it can be used to view content specific and general documentation to aid the user understand the data being presented to the user and/or the data being requested from the user.

Numerous modifications and variations of the present invention are possible in light of the above teachings. It is therefore to be understood that, within the scope of the appended claims, the invention may be practiced otherwise than as specifically described herein.

What is claimed is:

1. A method of monitoring a processing tool in a semiconductor processing system, the method comprising:
    putting the processing tool into a first state;
    executing a tool health control strategy;
    collecting tool health data for the processing tool;
    executing a tool health analysis strategy;
    analyzing the tool health data;
    pausing the processing tool when an alarm has occurred; and
    refraining from pausing the processing tool when an alarm has not occurred,
    wherein the executing of a tool health control strategy comprises determining a context and context-macthing the context with a control strategy.

2. The method as claimed in claim 1, wherein the putting of the processing tool into a first state comprises moving a wafer into the processing tool.

3. The method as claimed in claim 2, wherein the wafer comprises at least one of a product wafer, a dummy wafer, a diagnostic wafer, and a test wafer.

4. The method as claimed in claim 1, wherein the putting of the processing tool into a first state comprises moving a wafer into a process module.

5. The method as claimed in claim 4, wherein the wafer comprises at least one of a product wafer, a dummy wafer, a diagnostic wafer, and a test wafer.

6. The method as claimed in claim 1, wherein the putting of the processing tool into a first state comprises starting a process recipe.

7. The method as claimed in claim 1, wherein the context comprises a wafer ID, a tool ID, a recipe ID, a lot ID, and a material ID.

8. The method as claimed in claim 7, wherein the context further comprises a cassette ID, process module ID, a slot ID, a recipe start time, a recipe stop time, a maintenance counter value, and a product ID.

9. The method as claimed in claim 1, wherein the collecting of tool health data for the processing tool comprises:
    executing a data collection plan associated with the tool health control strategy; and
    executing a data pre-processing plan associated with the tool health control strategy.

10. The method as claimed in claim 9, wherein the collecting of tool health data for the processing tool further comprises executing a start-event judgment plan associated with the tool health control strategy.

11. The method as claimed in claim 10, wherein the executing of a start-event judgment plan comprises using a wafer-in event.

12. The method as claimed in claim 10, wherein the executing of a start-event judgment plan comprises:
    executing a set of SQL rules; and
    sending an alarm message to an intervention plan.

13. The method as claimed in claim 1, wherein the executing of a tool health control strategy comprises creating the tool health control strategy using a strategy configuration screen.

14. The method as claimed in claim 1, wherein the collecting of tool health data comprises creating a tool health data collection plan using a data collection plan configuration screen.

15. The method as claimed in claim 1, wherein the analyzing of the tool health data comprises creating a tool health analysis plan using a plan editor screen.

16. The method as claimed in claim 1, wherein the executing of a tool health analysis strategy comprises:
    determining a context; and
    context-matching the context with at least one tool health analysis strategy.

17. The method as claimed in claim 16, wherein the context comprises a wafer ID, a tool ID, a recipe ID, a lot ID, and a material ID.

18. The method as claimed in claim 17, wherein the context further comprises a cassette ID, a process module ID, a slot ID, a recipe start time, a recipe stop time, a maintenance counter value, and a product ID.

19. The method as claimed in claim 1, wherein the analyzing of tool health data for the processing tool comprises:
  executing at least one tool health analysis plan; and
  executing at least one end-event judgment plan associated with the tool health analysis strategy.

20. The method as claimed in claim 19, wherein the executing of at least one end-event judgment plan comprises:
  executing a set of SQL rules; and
  sending an alarm message to an intervention plan.

21. The method as claimed in claim 1, wherein the pausing of the processing tool when an alarm has occurred comprises executing an intervention plan.

22. The method as claimed in claim 21, wherein the executing of an intervention plan comprises:
  receiving an alarm message from at least one end-event judgment plan;
  processing the alarm message to determine the severity level; and
  pausing the processing tool when the severity level is above a threshold value.

23. The method as claimed in claim 21, wherein the executing of an intervention plan comprises:
  receiving an alarm message from at least one start-event judgment plan;
  processing the alarm message to determine the severity level; and
  pausing the processing tool when the severity level is above a threshold value.

24. A tool status monitoring system for monitoring a processing tool in a semiconductor processing system, the tool status monitoring system comprising:
  a plurality of sensors coupled to the processing tool;
  means for executing a tool health control strategy including means for executing a data collection plan for collecting tool health data, and means for executing a data pre-processing plan for pre-processing the collected tool health data, the data collection plan comprising a sensor plan for controlling the data collected by the plurality of sensors;
  means for executing a tool health analysis strategy including means for executing a analysis plan for analyzing the tool health data and means for executing a judgment plan for determining if an alarm has occurred; and
  an intervention manager for pausing the processing tool when an alarm has occurred and refraining from pausing the processing tool when an alarm has not occurred, wherein the means for executing of a tool health analysis strategy further comprises means for determining a context and means for context-matching the context with the tool health analysis strategy.

25. The tool status monitoring system as claimed in claim 24, further comprising means for putting the processing tool into a first state when a wafer moves into the processing tool.

26. The method as claimed in claim 25, wherein the wafer comprises at least one of a product wafer, a dummy wafer, a diagnostic wafer, and a test wafer.

27. The tool status monitoring system as claimed in claim 24, wherein the means for executing a tool health control strategy comprises:
  means for determining a context; and
  means for context-matching the context with the tool health control strategy.

28. The tool status monitoring system as claimed in claim 24, further comprising means for executing a start-event judgment plan associated with the tool health control strategy.

29. The tool status monitoring system as claimed in claim 24, wherein the means for executing a tool health control strategy comprises:
  at least one Strategy Configuration GUI screen for configuring the tool health control strategy; and at least one GUI screen for viewing tool health status.

30. The tool status monitoring system as claimed in claim 29, wherein the at least one Strategy Configuration GUI screen comprises a Title Panel, Information Panel, and Control Panel.

31. The tool status monitoring system as claimed in claim 24, wherein the means for executing a tool health control strategy comprises at least one screen from a group consisting of an English language screen, a Japanese language screen, a Taiwanese language screen, a Chinese language screen, a Korean language screen, a German language screen, and a French language screen.

32. The tool status monitoring system as claimed in claim 24, wherein the means for executing a tool health control strategy comprises a GUI screen for data collection plan configuration, and a GUI screen for preprocessing plan configuration.

33. The tool status monitoring system as claimed in claim 24, wherein the means for executing a tool health analysis strategy comprises at least one screen from a group consisting of an English language screen, a Japanese language screen, a Taiwanese language screen, a Chinese language screen, a Korean language screen, a German language screen, and a French language screen.

34. The tool status monitoring system as claimed in claim 24, wherein the intervention manager comprises weighting factors for inputs from start-event judgment plans and weighting factors for inputs from end-event judgment plans.

35. The tool status monitoring system as claimed in claim 24, wherein the analysis plan at least one of a Principal Component Analysis (PCA) plan, a Partial Least Squares (PLS) plan, a Statistical Process Control (SPC) plan, a Multivariate Analysis (MVA) plan, and a User Defined plan.

* * * * *